US012795985B2

(12) United States Patent
Lee et al.

(10) Patent No.: US 12,795,985 B2
(45) Date of Patent: Nov. 10, 2026

(54) SEMICONDUCTOR DEVICE AND METHOD OF FABRICATING THE SAME

(71) Applicant: Samsung Electronics Co., Ltd., Suwon-si (KR)

(72) Inventors: Won Hyuk Lee, Incheon (KR); Jong Chul Park, Seoul (KR); Sang Duk Park, Hwaseong-si (KR); Hong Sik Shin, Seoul (KR); Do Haing Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 278 days.

(21) Appl. No.: 18/502,324

(22) Filed: Nov. 6, 2023

(65) Prior Publication Data

US 2024/0072140 A1 Feb. 29, 2024

Related U.S. Application Data

(63) Continuation of application No. 17/318,079, filed on May 12, 2021, now Pat. No. 11,848,364.

(30) Foreign Application Priority Data

Oct. 5, 2020 (KR) ........................ 10-2020-0127856

(51) Int. Cl.

| | |
|---|---|
| ***H10D 30/62*** | (2025.01) |
| ***H10D 30/01*** | (2025.01) |
| ***H10W 20/40*** | (2026.01) |
| ***H10W 20/41*** | (2026.01) |
| ***H10W 20/42*** | (2026.01) |

(52) U.S. Cl.

CPC ....... *H10D 30/6219* (2025.01); *H10D 30/024* (2025.01); *H10D 30/62* (2025.01);

(Continued)

(58) Field of Classification Search

CPC ........ H10D 30/024–0245; H10D 30/62–6219; H10D 30/6729; H10D 30/43–435;

(Continued)

(56) References Cited

U.S. PATENT DOCUMENTS

| | | | | |
|---|---|---|---|---|
| 5,714,804 A | 2/1998 | Miller et al. | | |
| 2018/0096934 A1 * | 4/2018 | Siew | .................. | H10D 30/6219 |

(Continued)

FOREIGN PATENT DOCUMENTS

| | | | |
|---|---|---|---|
| CN | 110350027 A * | 10/2019 | ......... H01L 21/0217 |
| CN | 111092047 A | 5/2020 | |

(Continued)

OTHER PUBLICATIONS

English Translation of Li (Year: 2019).*

*Primary Examiner* — Wael M Fahmy
*Assistant Examiner* — Thomas Wilson Mccoy
(74) *Attorney, Agent, or Firm* — Wolf, Greenfield & Sacks, P.C.

(57) ABSTRACT

A semiconductor device includes, first and second source/drain patterns on an active pattern and spaced apart from each other, a first source/drain contact on the first source/drain pattern and including a first source/drain barrier film and a first source/drain filling film on the first source/drain barrier film, a second source/drain contact on the second source/drain pattern, and a gate structure on the active pattern between the first and second source/drain contacts and including a gate electrode, wherein a top surface of the first source/drain contact is lower than a top surface of the gate structure, and a height from a top surface of the active pattern to a top surface of the first source/drain barrier film is less than a height from the top surface of the active pattern to a top surface of the first source/drain filling film.

20 Claims, 31 Drawing Sheets

(52) U.S. Cl.
CPC ........... *H10W 20/40* (2026.01); *H10W 20/42* (2026.01); *H10W 20/435* (2026.01)

(58) Field of Classification Search
CPC ........... H10D 30/6757; H10D 30/6735; H10D 30/501–509; H10D 30/014; H10D 30/019–0198; H10D 84/0158; H10D 84/0193; H10D 84/834; H10D 84/853; H10D 84/0149; H10D 84/0186; H10D 84/851; H10D 84/852; H10D 84/832; H10D 84/833; H10D 86/011; H10D 86/215; H10D 64/251–259; H10D 62/119–123; H10D 30/6211; H10D 30/01; H10B 12/36; H10B 12/056; H01L 2924/13067; H01L 21/76843–76849; H01L 23/53223; H01L 23/53238; H01L 23/53252; H01L 23/53266; H10W 20/40–42; H10W 20/425
See application file for complete search history.

(56) References Cited

U.S. PATENT DOCUMENTS

2018/0096990 A1* 4/2018 Bi ......................... H01L 21/283
2018/0301564 A1* 10/2018 Kwon .................. H10D 64/017
2019/0148226 A1 5/2019 Yim et al.
2020/0006491 A1 1/2020 Bomberger et al.
2020/0066683 A1 2/2020 Kim et al.
2020/0127089 A1 4/2020 Hsu et al.
2020/0152739 A1* 5/2020 Yang ................. H01L 21/02568
2020/0411651 A1* 12/2020 Mannebach ........... H10D 88/00
2021/0351039 A1 11/2021 Huang et al.

FOREIGN PATENT DOCUMENTS

KR 20020078310 A 10/2002
KR 20050067566 A 7/2005
KR 100660552 B1 12/2006
KR 20120094208 A 8/2012
KR 101397571 B1 5/2014
KR 10-2016-0072476 A 6/2016
KR 20160125744 A 11/2016
KR 10-2018-0056031 A 5/2018
KR 20180082709 A 7/2018
KR 10-2020-0009655 A 1/2020
KR 10-2020-0023056 A 3/2020
KR 20200042563 A 4/2020
KR 10-2021-0137363 A 11/2021
TW I687977 B 3/2020

* cited by examiner

SEMICONDUCTOR DEVICE AND METHOD OF FABRICATING THE SAME

CROSS-REFERENCE TO RELATED APPLICATION

This U.S. non-provisional patent application is a continuation of and claims priority to U.S. patent application Ser. No. 17/318,079, filed on May 12, 2021, which claims priority under 35 U.S.C. § 119 to Korean Patent Application No. 10-2020-0127856, filed on Oct. 5, 2020, the entire contents of which are hereby incorporated by reference.

FIELD

The present disclosure relates to a semiconductor device and a method of fabricating the same.

BACKGROUND

With the rapid distribution of information media, the functions of semiconductor devices are also rapidly developing. For recent semiconductor products, lower cost for securing competitiveness and higher integration density for product quality may be desired. For high integration density, semiconductor devices are being scaled down.

Meanwhile, as the pitch size of semiconductor devices decreases, reducing capacitance and securing electrical stability between contacts in a semiconductor device may be of increased importance.

SUMMARY

Embodiments of the present disclosure provide a semiconductor device capable of improved performance and reliability.

Embodiments of the present disclosure also provide a method of fabricating a semiconductor device capable of improved performance and reliability.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, there is provided a semiconductor device comprising, first and second source/drain patterns on an active pattern and spaced apart from each other, a first source/drain contact on the first source/drain pattern and including a first source/drain barrier film and a first source/drain filling film on the first source/drain barrier film, a second source/drain contact on the second source/drain pattern, and a gate structure on the active pattern between the first and second source/drain contacts and including a gate electrode, wherein a top surface of the first source/drain contact is lower than a top surface of the gate structure relative to a top surface of the active pattern, and a height from the top surface of the active pattern to a top surface of the first source/drain barrier film is less than a height from the top surface of the active pattern to a top surface of the first source/drain filling film.

According to the aforementioned and other embodiments of the present disclosure, there is provided a semiconductor device comprising, a substrate including an active region and a field region, at least one active pattern in the active region, the at least one active pattern protruding from the substrate and extending in a first direction, a gate structure in the active region, the gate structure including a gate electrode that intersects the at least one active pattern and extends in a second direction, a source/drain pattern on the at least one active pattern, a gate contact on the gate electrode, wherein at least part of the gate contact is on the active region, a source/drain contact on the source/drain pattern, and a wiring structure on and electrically connected to the source/drain contact, wherein the source/drain contact includes first and second portions that are unitary, a height of a top surface of the second portion of the source/drain contact is greater than a height of a top surface of the first portion of the source/drain contact, the wiring structure is on the second portion of the source/drain contact, the source/drain contact includes a source/drain filling film and a source/drain barrier film, which extends along sidewalls and a bottom surface of the source/drain filling film, and in the first portion of the source/drain contact, the source/drain barrier film is on less than an entirety of the sidewalls of the source/drain filling film.

According to the aforementioned and other embodiments of the present disclosure, there is provided a semiconductor device comprising, first, second, and third source/drain patterns sequentially arranged on an active pattern and spaced apart from one another, a first source/drain contact on the first source/drain pattern and including a first source/drain barrier film and a first source/drain filling film on the first source/drain barrier film, a second source/drain contact on the second source/drain pattern and including a second source/drain barrier film and a second source/drain filling film on the second source/drain barrier film, a third source/drain contact on the third source/drain pattern and including a third source/drain barrier film and a third source/drain filling film on the third source/drain barrier film, a first gate structure between the first and second source/drain contacts and including a first gate electrode, a second gate structure between the second and third source/drain contacts and including a second gate electrode, and a gate contact on the first gate electrode, wherein top surfaces of the first and second source/drain contacts are lower than a top surface of the second gate structure relative to a top surface of the active pattern, a top surface of the third source/drain contact is substantially coplanar with a top surface of the second gate structure, and a height from the top surface of the active pattern to a top surface of the first source/drain barrier film is less than a height from the top surface of the active pattern to a top surface of the first source/drain filling film.

According to the aforementioned and other embodiments of the present disclosure, there is a method of manufacturing a semiconductor device comprising, forming a pre-source/drain contact, which includes a pre-source/drain barrier film and a pre-source/drain filling film on the pre-source/drain barrier film, on a source/drain pattern between adjacent gate structures, forming a source/drain contact, which includes a source/drain barrier film and a source/drain filling film, on the source/drain pattern by removing portions of the pre-source/drain barrier film and the pre-source/drain filling film, and recessing a portion of the source/drain barrier film, wherein the gate structures include gate electrodes, and a top surface of the source/drain barrier film is lower than top surfaces of the gate electrodes responsive to the recessing.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

FIGS. 1 through 31 illustrate semiconductor devices according to some embodiments of the present disclosure as including fin field-effect transistors (FinFETs) including fin-type channel regions, transistors including nanowires or nanosheets, or multibridge channel field-effect transistors (MBCFETs), but the present disclosure is not limited thereto. Additionally or alternatively, the semiconductor devices according to some embodiments of the present disclosure may include tunneling field-effect transistors (FETs) or three-dimensional (3D) transistors. Additionally or alternatively, the semiconductor devices according to some embodiments of the present disclosure may include planar transistors. Additionally or alternatively, the semiconductor devices according to some embodiments of the present disclosure may include bipolar junction transistors or laterally-diffused metal-oxide semiconductor (LDMOS) transistors.

A semiconductor device according to some embodiments of the present disclosure will hereinafter be described with reference to FIGS. 1 through 5B.

Figure 1:
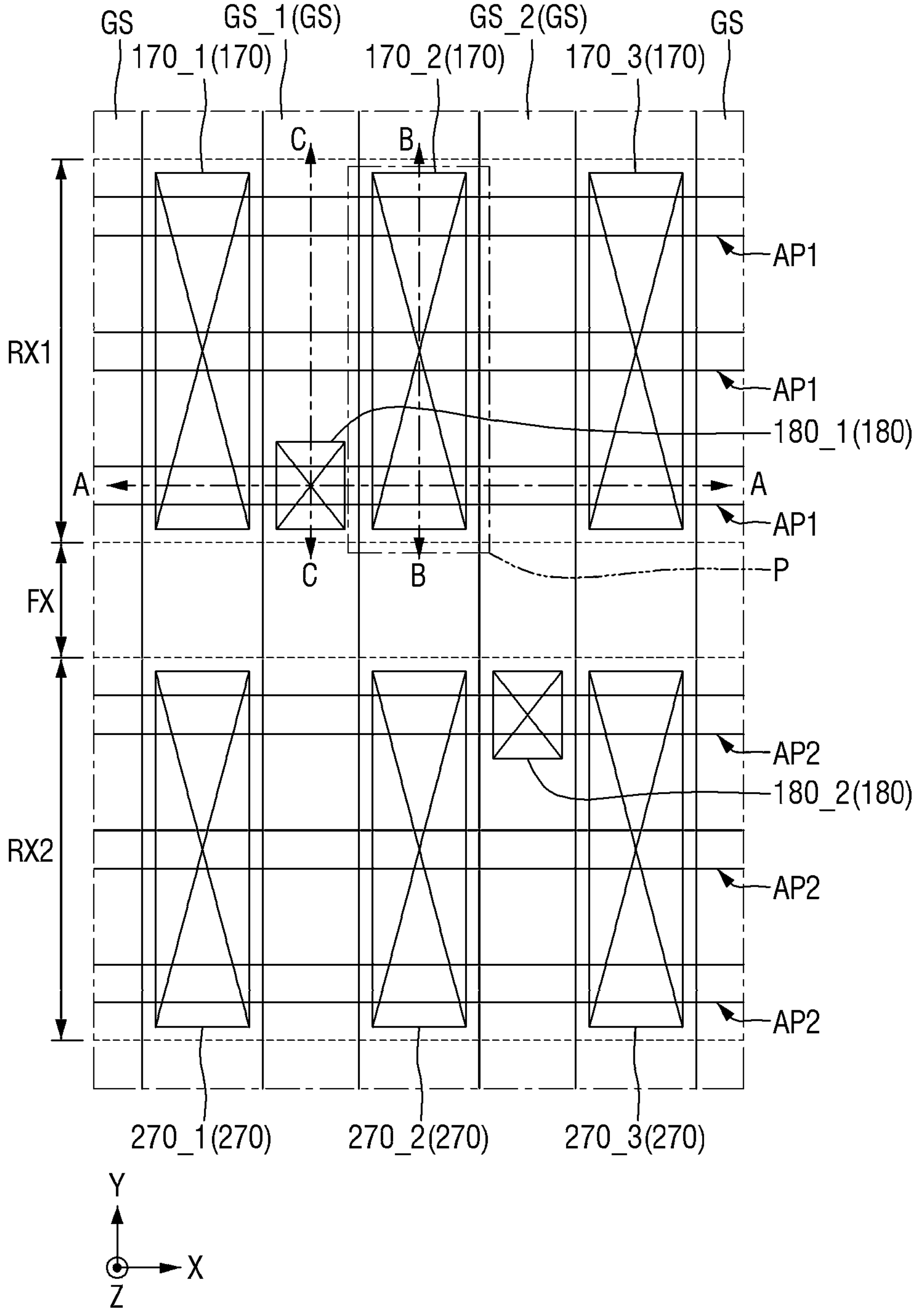
FIG. 1 is a layout view of a semiconductor device according to some embodiments of the present disclosure.
Figure 2:
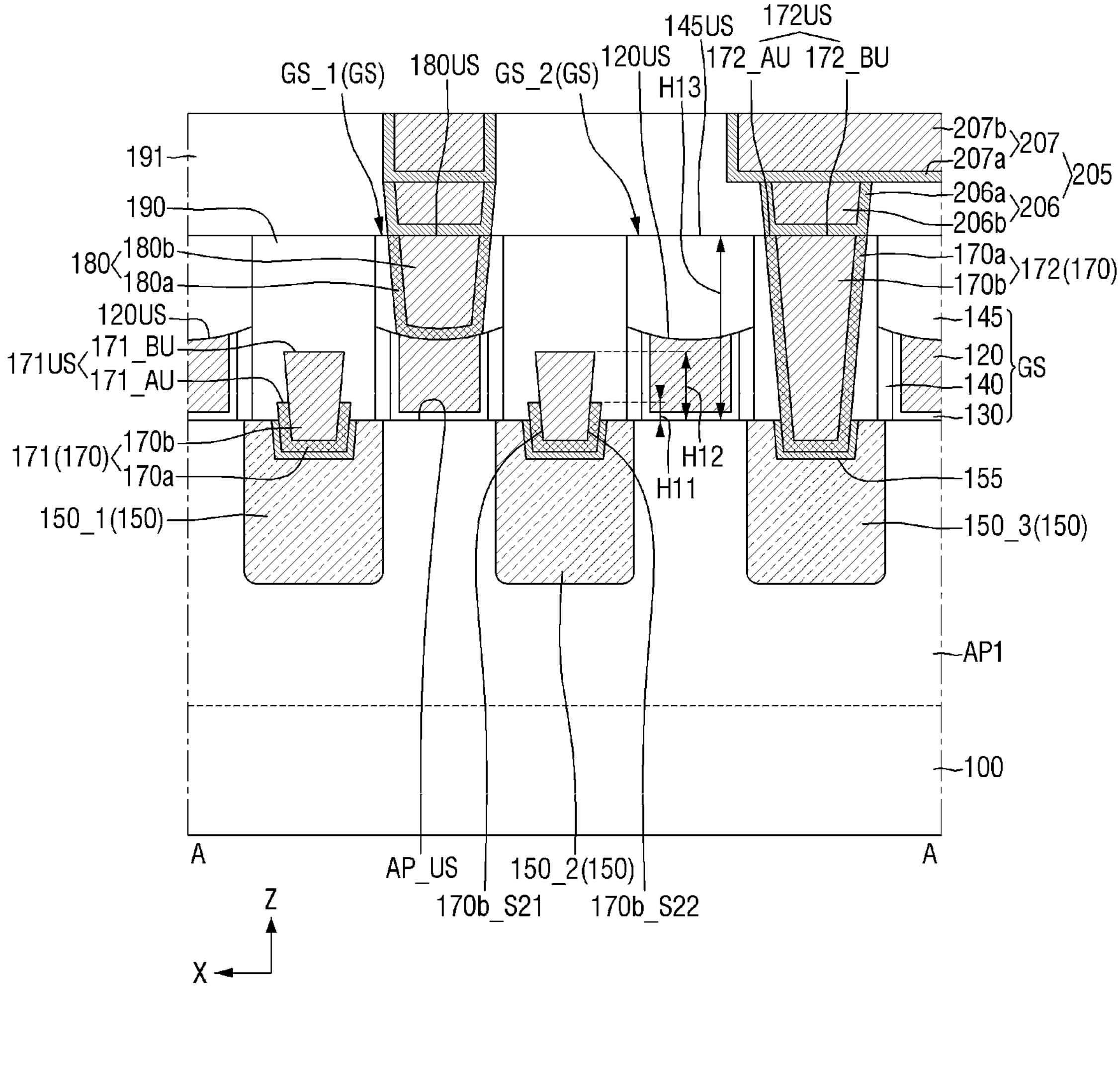
FIGS. 2, 3, and 4 are cross-sectional views taken along lines A-A, B-B, and C-C, respectively, of FIG. 1.
Figure 3:
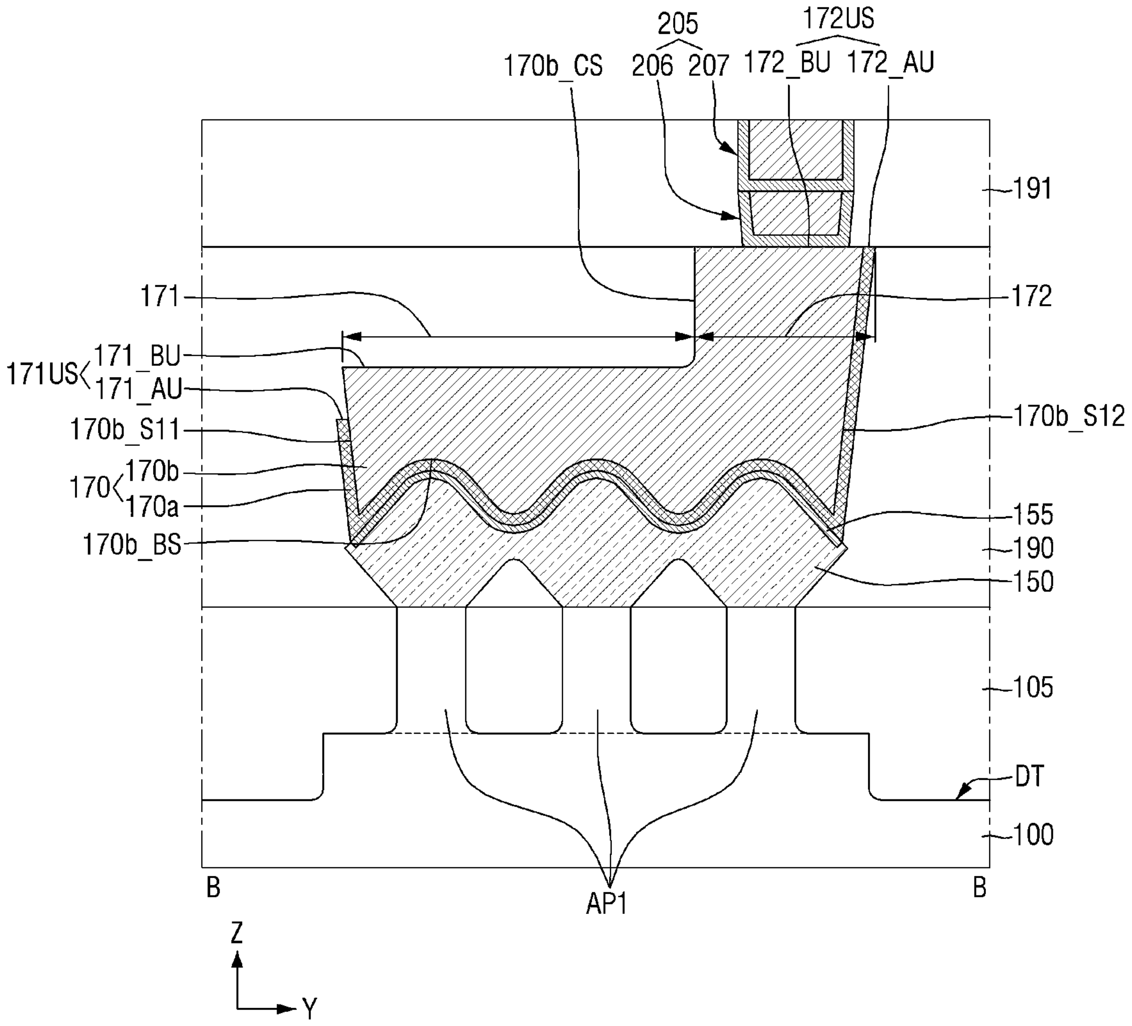
Figure 4:
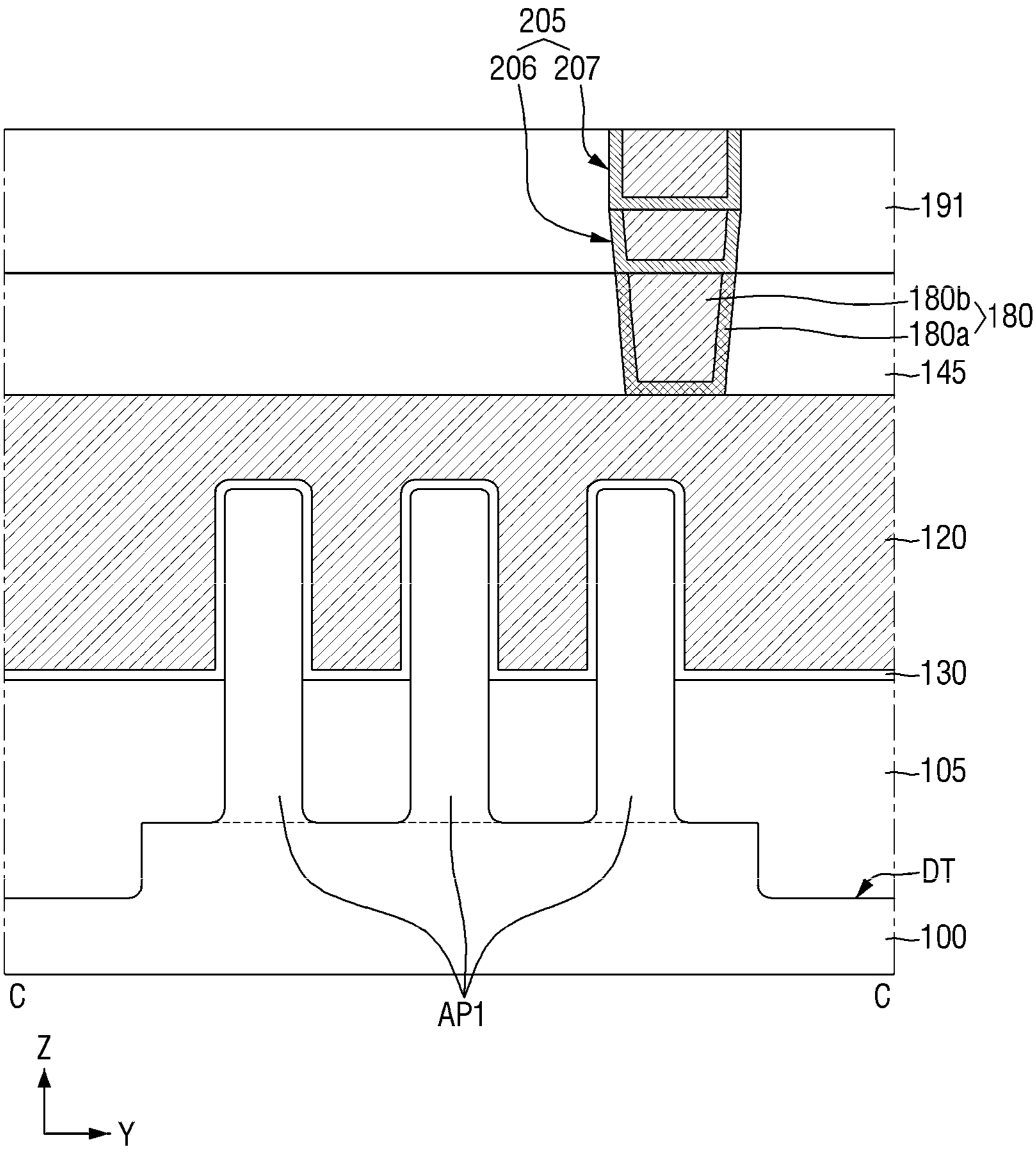
Figure 5A:
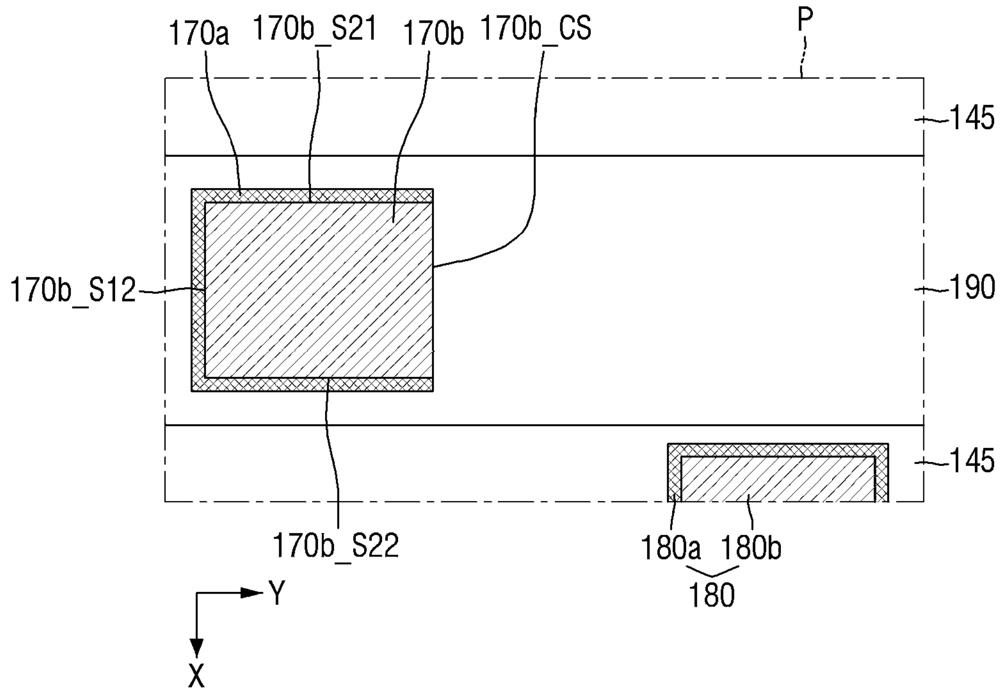
FIGS. 5A and 5B are plan views of part P of FIG. 1.
Figure 5B:
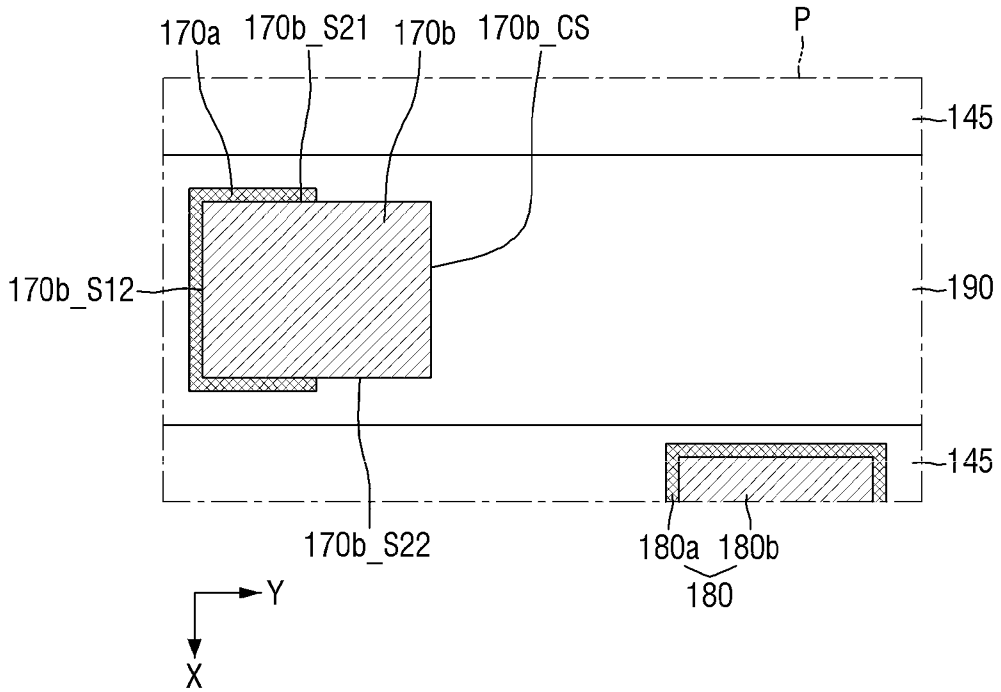

FIG. 1 is a layout view of a semiconductor device according to some embodiments of the present disclosure. FIGS. 2, 3, and 4 are cross-sectional views taken along lines A-A, B-B, and C-C, respectively, of FIG. 1. FIGS. 5A and 5B are plan views of part P of FIG. 1. For convenience, wiring structures 205 are not illustrated in FIG. 1.

Referring to FIGS. 1 through 5B, the semiconductor device according to some embodiments of the present disclosure may include one or more first active patterns AP1, one or more second active patterns AP2, one or more gate structures GS, first source/drain contacts 170, second source/drain contacts 270, and gate contacts 180.

A substrate 100 may include a first active region RX1, a second active region RX2, and a field region FX. The terms first, second, third, etc. may be used herein merely to distinguish one element or region from another. The field region FX may be formed directly adjacent to the first and second active regions RX1 and RX2. When elements or regions are referred to as directly on or adjacent one another, no intervening elements or regions may be present. The field region FX may form or define boundaries with the first and second active regions RX1 and RX2.

The first and second active regions RX1 and RX2 may be spaced apart from each other. The first and second active regions RX1 and RX2 may be separated by the field region FX.

In other words, an isolation film may be disposed near the first and second active regions RX1 and RX2, which are spaced apart from each other. Part of the isolation film between the first and second active regions RX1 and RX2 may be the field region FX. For example, an active region may be a region where the channel region of a transistor (as an example semiconductor device) is formed may be an active region, and a field region may be a region that defines the channel region of the transistor. In another example, an active region may be a region where a fin-type pattern or nanosheet for use as the channel region of a transistor is formed, and a field region may be a region where the fin-type pattern or the nanosheet is not formed.

As illustrated in FIGS. 3 and 4, the field region FX may be defined by deep trenches DT, but the present disclosure is not limited thereto. It will be apparent to those of ordinary skill in the art which part of the semiconductor device according to some embodiments of the present disclosure is a field region and which part of the semiconductor device according to some embodiments of the present disclosure is an active region.

The substrate 100 may be a silicon substrate or a silicon-on-insulator (SOI). Alternatively, the substrate 100 may include silicon germanium, silicon germanium-on-insulator (SGOI), indium antimonide, a lead tellurium compound, indium arsenic, indium phosphide, gallium arsenide, or gallium antimonide, but the present disclosure is not limited thereto.

The first active patterns AP1 may be formed in the first active region RX1. The first active patterns AP1 may protrude from the substrate 100, in the first active region RX1. The first active patterns AP1 may extend in a first direction X, on the substrate 100. The second active patterns AP2 may be formed in the second active region RX2. The second active patterns AP2 may be substantially the same as the first active patterns AP1. A surface of the substrate 100 and/or the active patterns AP1, AP2, may be used as a reference or base reference level for describing the relative heights of surfaces described herein.

The first active patterns AP1 may be, for example, fin-type patterns. The first active patterns AP1 may be used as the channel patterns of transistors. FIG. 1 illustrates three first active patterns AP1 and three second active patterns AP2, but the numbers of first active patterns AP1 and second active patterns AP2 are not particularly limited. That is, at least one first active pattern AP1 and at least one second active pattern AP2 may be provided.

The first active patterns AP1 and the second active patterns AP2 may be parts of the substrate 100 and may include epitaxial layers grown from the substrate 100. The first active patterns AP1 and the second active patterns AP2 may include, for example, an elemental semiconductor material such as silicon or germanium. Also, the first active patterns AP1 and the second active patterns AP2 may include, for example, a compound semiconductor such as a group IV-IV compound semiconductor or a group III-V compound semiconductor.

The group IV-IV compound semiconductor may be, for example, a binary or ternary compound including at least two of carbon (C), silicon (Si), germanium (Ge), and tin (Sn) or a compound obtained by doping the binary or ternary compound with a group IV element.

The group III-V compound semiconductor may be, for example, a binary, ternary, or quaternary compound obtained by combining at least one group III element such as aluminum (Al), gallium (Ga), and/or indium (In) and a group V element such as phosphorus (P), arsenic (As), or antimony (Sb).

A field insulating film 105 may be formed on the substrate 100. The field insulating film 105 may be formed in and across the first active region RX1, the second active region RX2, and the field region FX. The field insulating film 105 may fill the deep trenches DT. As used herein, an element that fills or surrounds or covers another element may partially or completely fill or surround or cover the recited element.

The field insulating film 105 may be formed on parts of sidewalls of the first active patterns AP1 and parts of sidewalls of the second active patterns AP2. The first active patterns AP1 and the second active patterns AP2 may protrude upwardly (relative to the substrate 100) beyond the top surface of the field insulating film 105. The field insulating film 105 may include, for example, an oxide film, a nitride film, an oxynitride film, or a combination thereof.

The gate structures GS may be disposed on the field insulating film 105. The gate structures GS may extend in a second direction Y. The gate structures GS may be spaced apart from one another in the first direction X.

The gate structures GS may be disposed on the first active patterns AP1 and the second active patterns AP2. The gate structures GS may intersect the first active patterns AP1 and the second active patterns AP2. The gate structures GS may include, for example, first and second gate structures GS_1 and GS_2.

The gate structures GS are illustrated as being disposed in and across the first and second active regions RX1 and RX2, but the present disclosure is not limited thereto. Alternatively, some of the gate structures GS may each be divided into two parts, and the two parts may be disposed in the first and second active regions RX1 and RX2.

The gate structures GS may include gate electrodes 120, gate insulating films 130, gate spacers 140, and gate capping patterns 145.

The gate electrodes 120 may be formed on the first active patterns AP1 and the second active patterns AP2. The gate electrodes 120 may intersect the first active patterns AP1 and the second active patterns AP2. The gate electrodes 120 may surround parts of the first active patterns AP1 and parts of the second active patterns AP2 that protrude beyond the top surface of the field insulating film 105. Each of the gate electrodes 120 may include long sides that extend in the second direction Y and short sides that extend in the first direction X.

Top surfaces 120US of the gate electrodes GS may be concave surfaces that bulge toward the top surfaces AP_US of the first active patterns AP1, but the present disclosure is not limited thereto. Alternatively, the top surfaces 120US of the gate electrodes GS may be flat.

The gate electrodes 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), Titanium carbide (TiC), tantalum carbonitride (TaCN), tungsten (W), Al, copper (Cu), cobalt (Co), titanium (Ti), tantalum (Ta), nickel (Ni), platinum (Pt), nickel-platinum (Ni—Pt), niobium (Nb), niobium nitride (NbN), niobium carbide (NbC), molybdenum (Mo), molybdenum nitride (MoN), molybdenum carbide (MoC), tungsten carbide (WC), Rhodium (Rh), palladium (Pd), iridium (Ir), osmium (Os), silver (Ag), gold (Au), zinc (Zn), vanadium (V), or a combination thereof.

The gate electrodes 120 may include a conductive metal oxide or a conductive metal oxynitride or may include an oxidized form of any one of the above-mentioned materials.

The gate spacers 140 may be disposed on sidewalls of the gate electrodes 120. The gate spacers 140 may extend in the second direction Y. The gate spacers 140 may include, for example, at least one of silicon nitride (SiN), silicon oxynitride (SiON), silicon oxide ($SiO_2$), silicon oxycarbide (SiOCN), silicon boron nitride (SiBN), silicon oxyboron nitride (SiOBN), silicon oxycarbide (SiOC), or a combination thereof.

The gate insulating films 130 may be formed on the first active patterns AP1, the second active patterns AP2, and the field insulating film 105. The gate insulating films 130 may be formed between the gate electrodes 120 and the gate spacers 140.

The gate insulating films 130 may be formed along the profile of parts of the first active patterns AP1 that protrude beyond the field insulating film 105 and along the top surface of the field insulating film 105. Although not specifically illustrated, interfacial films may be further formed along the profile of the parts of the first active patterns AP1 that protrude beyond the field insulating film 105. The gate insulating films 130 may be formed on the interfacial films. Although not specifically illustrated, the gate insulating films 130 may also be formed along the profile of parts of the second active patterns AP2 that protrude beyond the field insulating film 105.

The gate insulating films 130 may include silicon oxide, silicon oxynitride, silicon nitride, or a high-k material having a greater dielectric constant than silicon oxide. The high-k material may include, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some embodiments of the present disclosure may include a negative capacitance (NC)-FET using a negative capacitor. For example, the gate insulating films 130 may include ferroelectric material films having ferroelectric properties and paraelectric material films having paraelectric properties.

The ferroelectric material films may have negative capacitance, and the paraelectric material films may have positive capacitance. For example, in a case where two or more capacitors are connected in series and have positive capacitance, the total capacitance of the two or more capacitors may be less than the individual capacitance of each of the two or more capacitors. On the contrary, if at least one of the two or more capacitors has negative capacitance, the total capacitance of the two or more capacitors may have a positive value greater than the absolute value of the individual capacitance of each of the two or more capacitors.

In a case where the ferroelectric material films having negative capacitance and the paraelectric material films having positive capacitance are connected in series, the total capacitance of the gate insulating films 130 may increase. Accordingly, transistors including the ferroelectric material films can have a subthreshold swing (SS) of 60 mV/decade at room temperature.

The ferroelectric material films may have ferroelectric properties. The ferroelectric material films may include, for example, at least one of hafnium oxide, hafnium zirconium oxide, barium strontium titanium oxide, barium titanium oxide, or lead zirconium titanium oxide.

Here, the hafnium zirconium oxide may be a material obtained by doping hafnium oxide with zirconium (Zr). Alternatively, the hafnium zirconium oxide may be a compound of hafnium (Hf), Zr, and oxygen (O).

The ferroelectric material films may further include a dopant. For example, the dopant may include, for example, at least one of aluminum (Al), Ti, Nb, lanthanum (La), yttrium (Y), magnesium (Mg), Si, calcium (Ca), cerium (Ce), dysprosium (Dy), erbium (Er), gadolinium (Gd), germanium (Ge), scandium (Sc), strontium (Sr), or Sn. The type of the dopant may vary depending on the material of the ferroelectric material films.

In a case where the ferroelectric material films include hafnium oxide, the dopant may include, for example, at least one of Gd, Si, Zr, Al, or Y.

In a case where the dopant is Al, the ferroelectric material films may include about 3 to 8 atomic percent (at. %) of Si. Here, the percentage of the dopant may be the ratio of Al to the sum of Hf and Al.

In a case where the dopant is Si, the ferroelectric material films may include about 2 to 10 at. % of Si. In a case where the dopant is Y, the ferroelectric material films may include about 2 to 10 at. % of Y. In a case where the dopant is Gd, the ferroelectric material films may include about 1 to 7 at. % of Gd. In a case where the dopant is Zr, the ferroelectric material films may include about 50 to 80 at. % of Zr.

The paraelectric material films may have paraelectric properties. The paraelectric material films may include, for example, at least one of silicon oxide or a high-k metal oxide. The high-k metal oxide may include, for example, at least one of hafnium oxide, zirconium oxide, or aluminum oxide, but the present disclosure is not limited thereto.

The ferroelectric material films and the paraelectric material films may include the same material. The ferroelectric material films may have ferroelectric properties, and the paraelectric material films may not have ferroelectric properties. For example, in a case where the ferroelectric material films and the paraelectric material films both include hafnium oxide, the hafnium oxide of the ferroelectric material films and the hafnium oxide of the paraelectric material films may have different crystalline structures.

The ferroelectric material films may have a sufficient thickness to have ferroelectric properties. The ferroelectric material films may have a thickness of, for example, about 0.5 nm to 10 nm, but the present disclosure is not limited thereto. As the critical thickness for ferroelectricity may vary depending on the type of ferroelectric material, the thickness of the ferroelectric material films may vary depending on the material of the ferroelectric material films.

For example, each of the gate insulating films 130 may include one ferroelectric material film. In another example, each of the gate insulating films 130 may include a plurality of ferroelectric material films that are spaced apart from one another. Each of the gate insulating films 130 may have a structure in which a plurality of ferroelectric material films and a plurality of paraelectric material films are alternately stacked.

The gate capping patterns 145 may be disposed on the top surfaces 120US of the gate electrodes 120 and the top surfaces of the gate spacers 140. The gate capping patterns 145 may include, for example, at least one of silicon nitride (SiN), silicon oxynitride (SiON), silicon oxide ($SiO_2$), silicon carbonitride (SiCN), silicon oxycarbide (SiOCN), or a combination thereof.

Alternatively, the gate capping patterns 145 may be disposed between the gate spacers 140. In this case, top surfaces 145US of the gate capping patterns 145 may be placed on the same plane as or substantially coplanar with the top surfaces of the gate spacer 140. The top surfaces 145US of the gate capping patterns 145 will hereinafter be described as corresponding to the top surfaces of the gate structures GS.

Source/drain patterns (also referred to as source/drain regions) 150 may be disposed on the first active patterns AP1. The source/drain patterns 150 may be located on the substrate 100. The source/drain patterns 150 may include epitaxial patterns. The source/drain patterns 150 may be included in the sources/drains of transistors that use the first active patterns AP1 as channel regions.

The source/drain patterns 150 may include, for example, first, second, and third source/drain patterns 150_1, 150_2, and 150_3. The first, second, and third source/drain patterns 150_1, 150_2, and 150_3 may be sequentially arranged in the first direction X. The first, second, and third source/drain patterns 150_1, 1502, and 150_3 may be spaced apart from one another.

For example, the first gate structure GS_1 may be disposed between the first and second source/drain patterns 150_1 and 1502, and the second gate structure GS_2 may be disposed between the second and third source/drain patterns 150_2 and 150_3.

FIG. 3 illustrates that each of the source/drain patterns 150 is disposed on at least one first active pattern AP1. The source/drain patterns 150 may extend in the second direction Y. The source/drain patterns 150 may be connected to channel pattern portions, which are parts of the first active patterns AP1 that are used as channels.

Each of the source/drain patterns 150 is illustrated as including three epitaxial patterns formed on different first active patterns AP1 and merged together, but the present disclosure is not limited thereto. Alternatively, the three epitaxial patterns may be separated from one another. Alternatively, two adjacent epitaxial patterns may be merged together, and the other epitaxial patterns may be separated from the two adjacent epitaxial patterns.

For example, airgaps may be disposed between the field insulating film 105 and the source/drain patterns 150. In another example, the spaces between the field insulating film 105 and the source/drain patterns 150 may be filled with an insulating material.

The first source/drain contacts 170 may be disposed in the first active region RX1. The second source/drain contacts 270 may be disposed in the second active region RX2. The gate contacts 180 may be disposed on the gate structures GS.

For example, the first source/drain contacts 170 may include source/drain contacts 170_1, 170_2, and 170_3. For example, the second source/drain contacts 270 may include source/drain contacts 270_1, 270_2, and 270_3.

The first gate structure GS_1 may be disposed between the source/drain contacts 170_1 and 170_2 and between the source/drain contacts 270_1 and 270_2. The second gate structure GS_2 may be disposed between the source/drain contacts 170_2 and 170_3 and between the source/drain contacts 270_2 and 270_3.

Alternatively, some of the first source/drain contacts 170 may be directly connected to or continuous with some of the source/drain contacts 270. That is, at least one source/drain contact may be disposed in and across the first and second active regions RX1 and RX2. For example, the source/drain contacts 170_1 and 270_1 may be directly connected or continuous.

The gate contacts 180 may include first and second gate contacts 180_1 and 180_2. The first gate contact 180_1 may be disposed at a location overlapping with the first gate structure GS_1. The second gate contact 1802 may be disposed at a location overlapping with the second gate structure GS_2. Alternatively, the second gate contact 180_2 may be disposed in the first active region RX1.

At least some of the gate contacts 180 may be disposed at locations overlapping with at least one of the first and second active regions RX1 and RX2. The first and second gate contacts 180_1 and 1802 may be disposed at least in part in the first and second active regions RX1 and RX2. That is, the first and second gate contacts 180_1 and 180_2 may be disposed at least in part at locations overlapping with the first and second active regions RX1 and RX2.

For example, the first gate contact 1801 may be disposed generally in the first active region RX1. The first gate contact 180_1 may be disposed generally at a location corresponding to the first active region RX1. For example, the second gate contact 180_2 may be disposed generally in the second active region RX2. The second gate contact 180_2 may be disposed generally at a location corresponding to the second active region RX2.

The first source/drain contacts 170 may be connected to source/drain patterns 150 formed in the first active region RX1. Although not specifically illustrated, the second source/drain contacts 270 may be connected to source/drain patterns formed in the second active region RX2. The first and second gate contacts 180_1 and 180_2 may be connected to the gate electrodes 120 included in the gate structures GS.

The first source/drain contacts 170 and the first gate contact 180_1, which are disposed in the first active region RX1, will hereinafter be described.

The first source/drain contacts 170 may be connected to the source/drain patterns 150. The first source/drain contacts 170 may be disposed on the source/drain patterns 150.

Silicide films 155 may be formed between the first source/drain contacts 170 and the source/drain patterns 150. The silicide films 155 are illustrated as being formed along the profile of the interfaces between the source/drain patterns 150 and the first source/drain contacts 170, but the present disclosure is not limited thereto. The silicide films 155 may include, for example, a metal silicide material.

The source/drain contact 1701 may be connected to the first source/drain pattern 150_1. The source/drain contact 170_2 may be connected to the second source/drain pattern 150_2. The source/drain contact 1703 may be connected to the third source/drain pattern 150_3.

For example, the first gate contact 1801 may be disposed between the source/drain contacts 170_1 and 170_2.

The first source/drain contacts 170 may include first source/drain barrier films **170*a* and first source/drain filling films 170*b* on the first source/drain barrier films 170*a*. Each of the source/drain contacts 170_1, 170_2, and 170_3 may include a first source/drain barrier film 170*a* and a first source/drain filling film 170*b***.

The first source/drain filling films **170*b* may include sidewalls (170*b*_S11, 170*b*_S12, 170*b*_S21, and 170*b*_S22) and bottom surfaces 170*b*_BS. Sidewalls 170*b*_S11 of the first source/drain filling films 170*b* may be opposite to sidewalls 170*b*_S12 of the first source/drain filling films 170*b* in the second direction Y. Sidewalls 170*b*_S21 of the first source/drain filling films 170*b* may be opposite to sidewalls 170*b*_S22 of the first source/drain filling films 170*b*** in the first direction X.

The bottom surfaces **170*b*_BS of the first source/drain filling films 170*b* may have an undulating or wavy or other non-planar shape, but the present disclosure is not limited thereto. Alternatively, the bottom surfaces 170*b*_BS of the first source/drain filling films 170*b*** may be flat or substantially planar.

The first source/drain barrier films **170*a* may extend along the sidewalls (170*b*_S11, 170*b*_S12, 170*b*_S21, and 170*b*_S22) and the bottom surfaces 170*b*_BS of the first source/drain filling films 170*b*. The first source/drain barrier films 170*a* may extend along the entire bottom surfaces 170*b*_BS of the first source/drain filling films 170*b***.

The first source/drain barrier films **170*a* may extend along parts of (e.g., less than an entirety of) the sidewalls (170*b*_S11, 170*b*_S12, 170*b*_S21, and 170*b*_S22) of the first source/drain filling films 170*b*. That is, the sidewalls (170*b*_S11, 170*b*_S12, 170*b*_S21, and 170*b*_S22) of the first source/drain filling films 170*b* may include parts of the first source/drain filling films 170*b* that are not covered by the first source/drain barrier films 170*a***. This will be described later.

The first source/drain barrier films **170*a*** may include, for example, at least one of Ta, TaN, Ti, TiN, Ru, Co, Ni, nickel-boron (NiB), W, WN, tungsten carbonitride (WCN), Zr, zirconium nitride (ZrN), V, vanadium nitride (VN), Nb, NbN, Pt, Ir, Rh, or a two-dimensional (2D) material. The 2D material may be a metallic material and/or a semiconductor material. The 2D material may include a 2D allotrope or a 2D compound. The 2D material may include, for example, at least one of molybdenum disulfide ($MoS_2$), molybdenum diselenide ($MoSe_2$), tungsten diselenide ($WSe_2$), or tungsten disulfide ($WS_2$), but the present disclosure is not limited thereto. That is, the type of the 2D material is not particularly limited.

The first source/drain filling films **170*b*** may include, for example, at least one of Al, W, Co, Ru, Ag, Au, manganese (Mn), or Mo.

The first source/drain contacts 170 may include first portions 171 and second portions 172. The first portions 171 of the first source/drain contacts 170 may be directly connected to or continuous with the second portions 172 of the first source/drain contacts 170. That is, the first and second portions 171 and 172 of the first source/drain contacts 170 may be portions of a monolithic or unitary structure.

The second portions 172 of the first source/drain contacts 170 may be parts of the first source/drain contacts 170 where the wiring structures 205 land. The first source/drain contacts 170 may be connected to the wiring structures 205 through the second portions 172 of the first source/drain contacts 170. The first portions 171 of the first source/drain contacts 170 may not be parts of the first source/drain contacts 170 where the wiring structures 205 land. That is, the first portions 171 of the first source/drain contacts 170 may not vertically overlap with the wiring structures 205.

For example, as illustrated in FIG. 2, the second portions 172 of the first source/drain contacts 170 may be located at parts of the first source/drain contacts 170 that are on or contacting the wiring structures 205. The first portions 171 of the first source/drain contacts 170 may be located at parts of the first source/drain contacts 170 that are not on or contacting the wiring structures 205.

To prevent the gate contacts 180 from being in contact with the first source/drain contacts 170, the first portions 171 of the first source/drain contacts 170, but not the second portions 172 of the first source/drain contacts 170, may be located at opposing sides of each of the gate structures GS that are connected to the gate contacts 180. That is, as illustrated in FIG. 2, first portions 171 of first source/drain contacts 170, but not second portions 172 of the first source/drain contacts 170, may be located at opposing sides of the first gate structure GS_1 that is connected to one of the gate contacts 180.

The top surfaces of the first source/drain contacts 170 may include top surfaces 171US of the first portions 171 of the first source/drain contacts 170 and top surfaces 172US of the second portions 172 of the first source/drain contacts 170. The first source/drain filling films 170*b* may include connecting sidewalls 170*b*_CS, which connect the top surfaces 171US of the first portions 171 of the first source/drain contacts 170 and the top surfaces 172US of the second portions 172 of the first source/drain contacts 170.

The first portions 171 and the second portions 172 of the first source/drain contacts 170 may include the first source/drain barrier films 170*a* and the first source/drain filling films 170*b*. The first source/drain filling films 170*b* of the first source portions 171 of the first source/drain contacts 170 may be continuous or unitary to the first source/drain filling films 170*b* of the second portions 172 of the first source/drain contacts 170.

In the second portions 172 of the first source/drain contacts 170, the first source/drain filling films 170*b* may have a continuous or integral structure to extend from the source/drain patterns 150 to the wiring structures 205. Here, the term "integral structure" means that parts of the first source/drain filling films 170*b* may all be formed at once by the same manufacturing process.

The top surfaces 171US of the first portions 171 of the first source/drain contacts 170 may include top surfaces 171_AU of first partial barrier films and top surfaces 171_BU of first partial filling films. The top surfaces 172US of the second portions 172 of the first source/drain contacts 170 may include top surfaces 172_AU of second partial barrier films and top surfaces 172_BU of second partial filling films.

In the first portions 171 of the first source/drain contacts 170, a height H11 from top surfaces AP_US of the first active pattern AP1 to the top surfaces 171_AU of the first partial barrier films may be less than a height H12 from the top surfaces AP_US of the first active patterns AP1 to the top surfaces 171_BU of the first partial filling films. That is, the top surfaces 171_BU of the first partial filling films may be higher than the top surfaces 171_AU of the first partial filling films with respect to the top surfaces AP_US of the first active patterns AP1.

For example, in the first portions 171 of the first source/drain contacts 170, parts of the first source/drain filling films 170*b* may protrude upwardly beyond the top surfaces 171_AU of the first partial barrier films. In the first portions 171 of the first source/drain contacts 170, the first source/drain filling films 170*b* may include lower portions that are surrounded by the first source/drain barrier films 170*a* and upper portions that protrude upwardly (e.g., away from the substate 100) beyond the top surfaces 171_AU of the first partial barrier films.

The top surfaces 171_BU of the first partial filling films are illustrated as being flat or substantially planar in the first portions 171 of the first source/drain contacts 170, but the present disclosure is not limited thereto.

The top surfaces 171US of the first portions 171 of the first source/drain contacts 170 are lower than the top surfaces 145US of the gate structures GS with respect to the top surfaces AP_US of the first active patterns AP1 as a base reference level. The top surfaces 171_BU of the first partial filling films are lower than the top surfaces 145US of the gate structures GS with respect to the top surfaces AP_US of the first active patterns AP1.

The top surfaces 171_BU of the first partial filling films may be lower than the top surfaces 120US of the gate electrodes 120 with respect to the top surfaces AP_US of the first active patterns AP1.

The height from the top surfaces AP_US of the first active patterns AP1 to the top surfaces 120US of the gate electrodes 120 may be greater than the height H12 from the top surfaces AP_US of the first active patterns AP1 to the top surfaces 171_BU of the first partial filling films. In a case where the top surfaces 120US of the gate electrodes 120 are concave in a cross-sectional view, the height of the top surfaces 120US of the gate electrodes 120 may be the height of the closest parts or portions of the gate electrodes 120 to the top surfaces AP_US of the first active patterns AP1.

In the first portions 171 of the first source/drain contacts 170, the top surfaces 171_AU of the first partial barrier films are higher than the top surfaces AP_US of the first active patterns AP1 and lower than the top surfaces 120US of the gate electrodes 120. As a result, damage to the source/drain patterns 150 can be reduced or prevented during the etching of the top surfaces 171_AU of the first partial barrier films to be lower than the top surfaces 171_BU of the first partial filling films.

As illustrated in FIG. 2, the top surfaces 172US of the second portions 172 of the first source/drain contacts 170 may be higher than the top surfaces 171US of the first portions 171 of the first source/drain contacts 170 with respect to the top surfaces AP_US of the first active patterns AP1. In other words, as illustrated in FIG. 3, the top surfaces 172US of the second portions 172 of the first source/drain contacts 170 may be higher than the top surfaces 171US of the first portions 171 of the first source/drain contacts 170 with respect to the top surface of the field insulating film 105.

The height from the top surfaces AP_US of the first active patterns AP1 to the top surfaces of the first source/drain contacts 170 may be the same as a height H13 from the top surfaces AP_US of the first active patterns AP1 to the top surfaces 145US of the gate structures GS. As the top surfaces 172US of the second portions 172 of the first source/drain contacts 170 are higher than the top surfaces 171US of the first portions 171 of the first source/drain contacts 170, the height from the top surfaces AP_US of the first active patterns AP1 to the top surfaces of the first source/drain contacts 170 may refer to the top surfaces 172US of the second portions 172 of the first source/drain contacts 170.

The height H13 from the top surfaces AP_US of the first active patterns AP1 to the top surfaces 145US of the gate structures GS may be the same as the height from the top surfaces AP_US of the first active patterns AP1 to the top surfaces 172US of the second portions 172 of the first source/drain contacts 170. The top surfaces 172US of the second portions 172 of the first source/drain contacts 170 may be placed on the same plane as or substantially coplanar with the top surfaces 145US of the gate structures GS. For example, the top surfaces 172US of the second portions 172 of the first source/drain contacts 170, particularly, the top surfaces 172_BU of the first source/drain filling films 170*b*, may be placed on the same plane as or substantially coplanar with the top surfaces 145US of the gate structures GS.

For example, the source/drain contacts 170_1, 170_2, and 170_3 may include first portions 171 and second portions 172. In another example, first source/drain contacts 170 that are not connected to the wiring structures 205, among the source/drain contacts 170_1, 170_2, and 1703, may include first portions 171, but no second portions 172.

In the first portions 171 of the first source/drain contacts 170, the sidewalls 170*b*_S11 of the first source/drain filling films 170*b* may include portions that are covered by the first source/drain barrier films 170*a* and portions that are not covered by or free of the first source/drain barrier films 170*a*. The sidewalls 170*b*_S21 and the sidewalls 170*b*_S22 of the first source/drain filling films 170*b* may include portions that are covered by the first source/drain barrier films 170*a* and portions that are not covered by or free of the first source/drain barrier films 170*a*. In other words, in the first portions 171 of the first source/drain contacts 170, the first source/drain barrier films 170*a* may be disposed on parts of (but on less than an entirety of) sidewalls of the first source/drain filling films 170*b*.

Since a first interlayer insulating film 190 is disposed on the top surfaces 171US of the first portions 171 of the first source/drain contacts 170, the second portions 172 of the first source/drain contacts 170 are illustrated in the plan views of FIGS. 5A and 5B, but the first portions 171 of the first source/drain contacts 170 are not illustrated in FIGS. 5A and 5B.

As illustrated in FIG. 5A, in the second portions 172 of the first source/drain contacts 170, the first source/drain barrier films 170*a* may generally cover the sidewalls 170*b*_S12, the sidewalls 170*b*_S21, and the sidewalls 170*b*_S22 of the first source/drain filling films 170*b*, but are not disposed on the connecting sidewalls 170*b*_CS of the first source/drain filling films 170*b*. As illustrated in FIG. 2, in the second portions 172 of the first source/drain contacts 170, the sidewalls 170*b*_S21 and the sidewalls 170*b*_S22 of the first source/drain filling films 170*b* may be generally covered by the first source/drain barrier films 170*a*.

As illustrated in FIG. 5B, in the second portions 172 of the first source/drain contacts 170, the first source/drain barrier films 170*a* may generally cover the sidewalls 170*b*_S12 of the first source/drain filling films 170*b*. The first source/drain barrier films 170*a* may be partially removed in the second direction Y to not cover parts of the sidewalls 170*b*_S21 and the sidewalls 170*b*_S22 of the first source/drain filling films 170*b*. Parts of the first source/drain barrier films 170*a* on the sidewalls 170*b*_S21 and the sidewalls 170*b*_S22 of the first source/drain filling films 170*b* may be etched in the second direction Y during an etching process for lowering the top surfaces 171_AU of the first partial barrier films below the top surfaces 171_BU of the first partial filling films.

Figure 9:
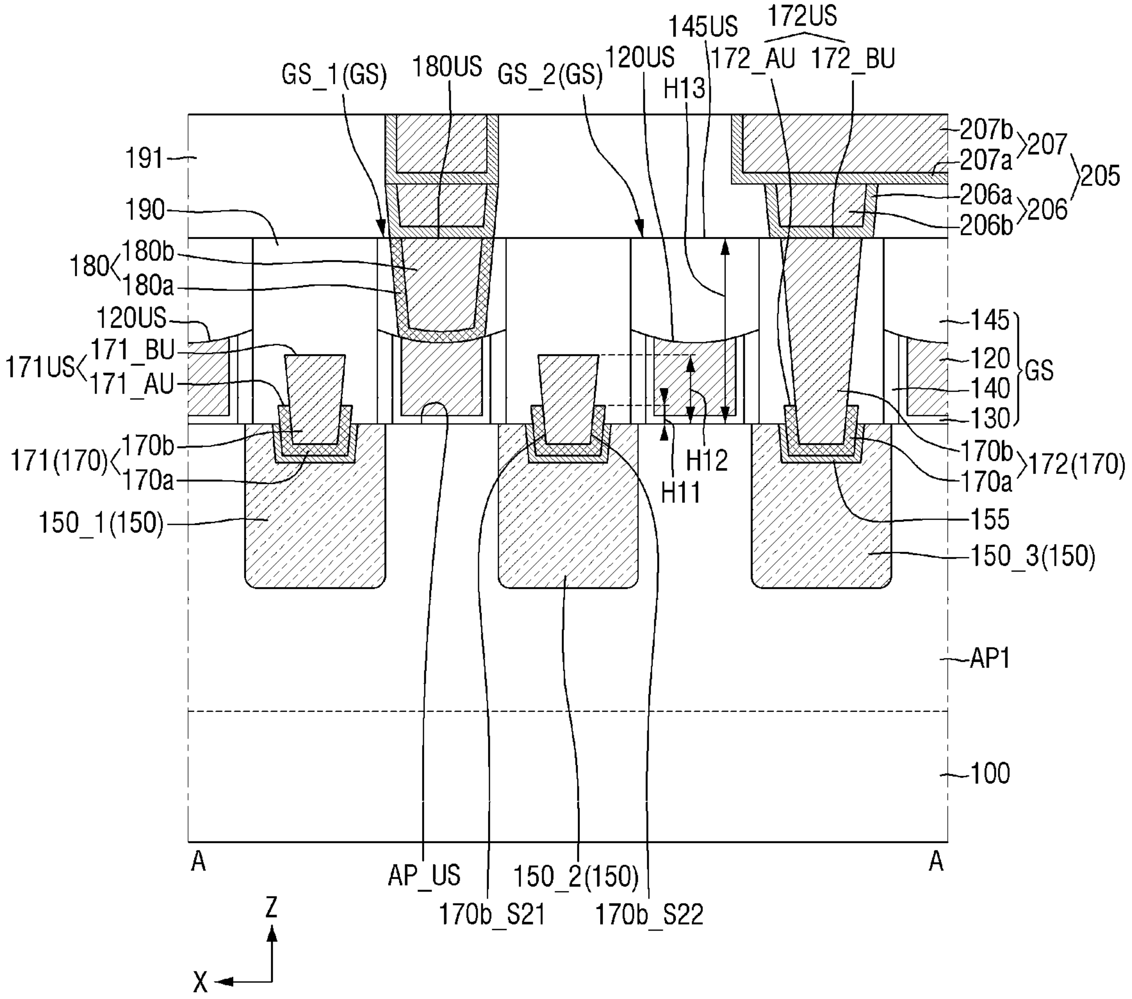
FIGS. 9 and 10 are cross-sectional views of a semiconductor device according to some embodiments of the present disclosure.

Referring to FIG. 5B, when parts of the semiconductor device according to some embodiments of the present disclosure where the first source/drain barrier films 170*a* are formed are cut in the first direction X, the second portions 172 of the first source/drain contacts 170 may appear as illustrated in FIG. 2 (i.e., when viewed in cross-section along the X-direction). When parts of the semiconductor device according to some embodiments of the present disclosure where the first source/drain barrier films 170*a* are not formed are cut in the first direction X, the second portions 172 of the first source/drain contacts 170 may appear as illustrated in FIG. 9 (i.e., when viewed in cross-section along the X-direction).

Referring to FIG. 2, each of the first source/drain contacts 170 may not be in contact with at least one of two gate structures GS on opposing sides thereof. For example, each of the second portions 172 of the first source/drain contacts 170 may not be in contact with at least one of two gate structures GS on opposing sides thereof.

The first source/drain contacts 170 are illustrated in FIG. 3 as having an L shape, but the present disclosure is not limited thereto. Alternatively, the first source/drain contacts 170 may have an inverted T shape. In this case, the first portions 171 of the first source/drain contacts 170 may be disposed on opposing sides of the second portions 172 of the first source/drain contacts 170.

The gate contacts 180 may be disposed on the gate electrodes 120. The gate contacts 180 may be connected to the first gate electrodes 120 through the gate capping patterns 145. Top surfaces 180US of the gate contacts 180 may be placed on the same plane as or substantially coplanar with the top surfaces 145US of the gate structures GS.

The gate contacts 180 may include gate barrier films 180*a* and gate filling films 180*b* on the gate barrier films 180*a*. The materials of the gate barrier films 180*a* and the gate filling films 180*b* may be substantially the same as the materials of the first source/drain barrier films 170*a* and the first source/drain filling films 170*b*.

The first portions 171 of the first source/drain contacts 170 may be disposed near the gate electrodes 120 where the gate contacts 180 are disposed. As the first portions 171 of the first source/drain contacts 170 are disposed near the gate contacts 180, the distance between the gate contacts 180 and the first source/drain contacts 170 may be increased. Also, as the top surfaces 171_AU of the first partial barrier films are lower than the top surfaces 171_BU of the first partial filling films in the first portions 171 of the first source/drain contacts 170, the gate contacts 180 may be further spaced apart from the first source/drain contacts 170 in the first direction X by as much as the thickness of the first source/drain barrier films 170*a*. Also, the gate contacts 180 may be further spaced apart from the first source/drain contacts 170 in a third direction Z by as much as the height by which the first source/drain barrier films 170*a* are removed. As the distances, in the first and third directions X and Z, between the first source/drain contacts 170 and the gate contacts 180 increase, short circuits between the first source/drain contacts 170 and the gate contacts 180 can be prevented.

In addition, as the distance between the gate electrodes 120 and the first source/drain filling films 170*b* of the first portions 171 of the first source/drain contacts 170 increases, the parasitic capacitance between the gate electrodes 120 and the first source/drain contacts 170 can be reduced. As a result, the performance and the reliability of the semiconductor device according to some embodiments of the present disclosure can be improved.

The first interlayer insulating film 190 may be formed on the field insulating film 105. The first interlayer insulating film 190 may be disposed on the top surfaces 171US of the first portions 171 of the first source/drain contacts 170. The first interlayer insulating film 190 may cover the top surfaces 171US of the first portions 171 of the first source/drain contacts 170. The first interlayer insulating film 190 may surround the first source/drain contacts 170. The top surface of the first interlayer insulating film 190 may be placed on the same plane as or substantially coplanar with the top surfaces 145US of the gate structures GS.

In regions where the first portions 171 of the first source/drain contacts 170 are disposed, the first interlayer insulating film 190 may fill the spaces between the gate structures GS and parts of the first source/drain filling films 170*b* that protrude beyond the first source/drain barrier films 170*a*.

The first interlayer insulating film 190 may include, for example, at least one of silicon oxide, silicon nitride, silicon oxynitride, or a low-k material. The low-k material may include, for example, fluorinated tetraethyl orthosilicate (FTEOS), hydrogen silsesquioxane (HSQ), bis-benzocyclobutene (BCB), tetramethyl orthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazen (TOSZ), fluoride silicate glass (FSG), polyimide nanofoam such as polypropylene oxide, carbon-doped silicon oxide (CDO), organo-silicate glass (OSG), SiLK, amorphous fluorinated carbon, silica aerogel, silica xerogel, mesoporous silica, or a combination thereof, but the present disclosure is not limited thereto.

A second interlayer insulating film 191 may be disposed on the first interlayer insulating film 190. The second interlayer insulating film 191 may include, for example, at least one of silicon oxide, silicon nitride, silicon carbonitride, silicon oxynitride, or a low-k material.

The wiring structures 205 may be disposed in the second interlayer insulating film 191. The wiring structures 205 may be connected to, for example, the first source/drain contacts 170, the gate contacts 180, and the second source/drain contacts 270. For example, the wiring structures 205 may be connected to the second portions 172 of the first source/drain contacts 170, on the first source drain contacts 170.

The wiring structures 205 may include vias 206 and wiring patterns 207. The vias 206 may include via barrier films 206*a* and via filling films 206*b*. The wiring patterns 207 may include wiring barrier films 207*a* and wiring filling films 207*b*. The via barrier films 206*a* and the wiring barrier films 207*a* may include, for example, at least one of Ta, TaN, Ti, TiN, Ru, Co, Ni, NiB, W, WN, WCN, Zr, ZrN, V, VN, Nb, NbN, Pt, Ir, Rh, or a 2D material. The via filling films 206*b* and the wiring filling films 207*b* may include, for example, at least one of Al, Cu, W, Co, Ru, Ag, Au, Mn, or Mo.

Alternatively, the vias 206 and/or the wiring patterns 207 may not include barrier films (206*a* or 207*a*).

The wiring patterns 207 are illustrated in FIG. 2 as extending in the first direction X, but the present disclosure is not limited thereto.

Figure 6:
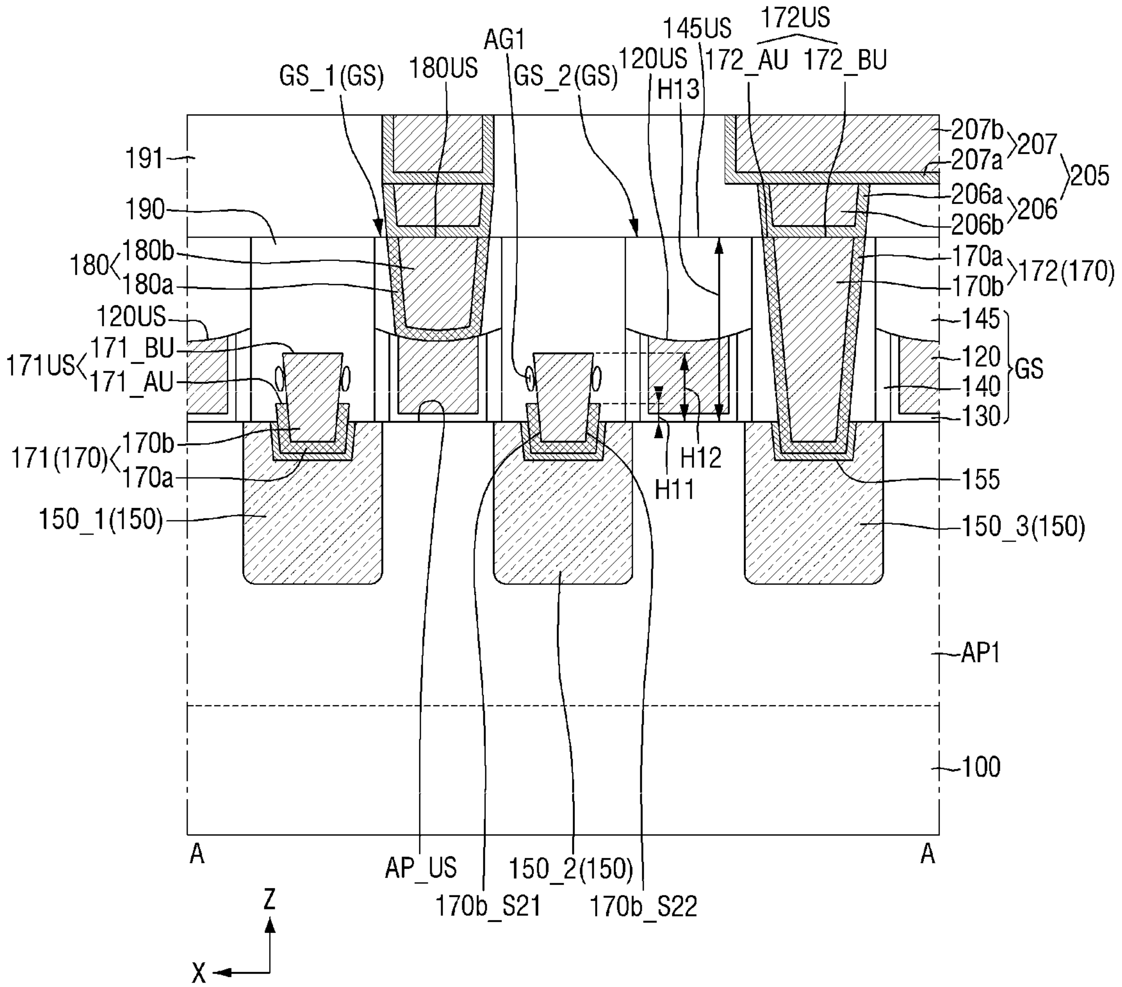
FIG. 6 is a cross-sectional view of a semiconductor device according to some embodiments of the present disclosure.
Figure 7:
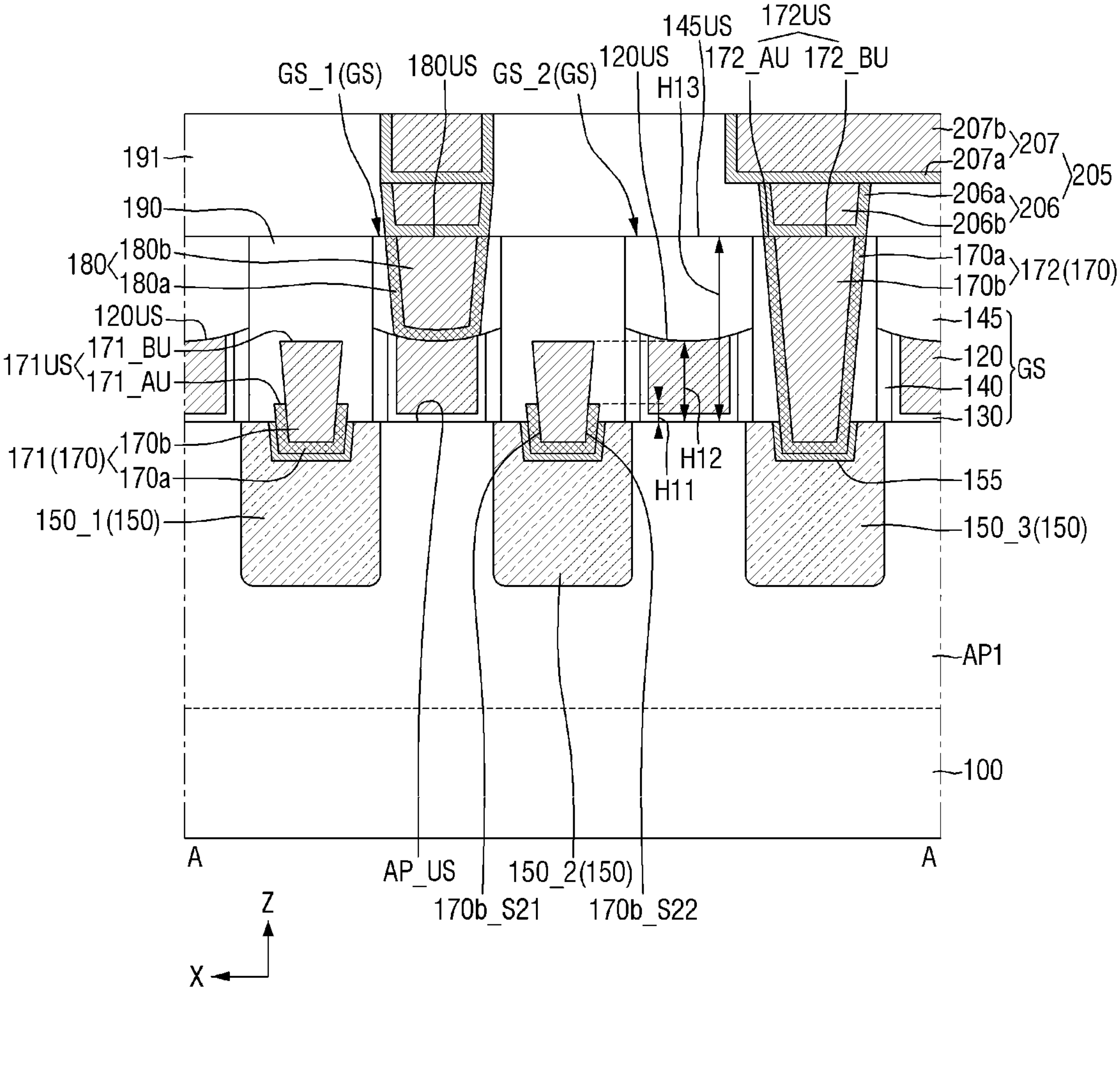
FIG. 7 is a cross-sectional view of a semiconductor device according to some embodiments of the present disclosure.
Figure 8:
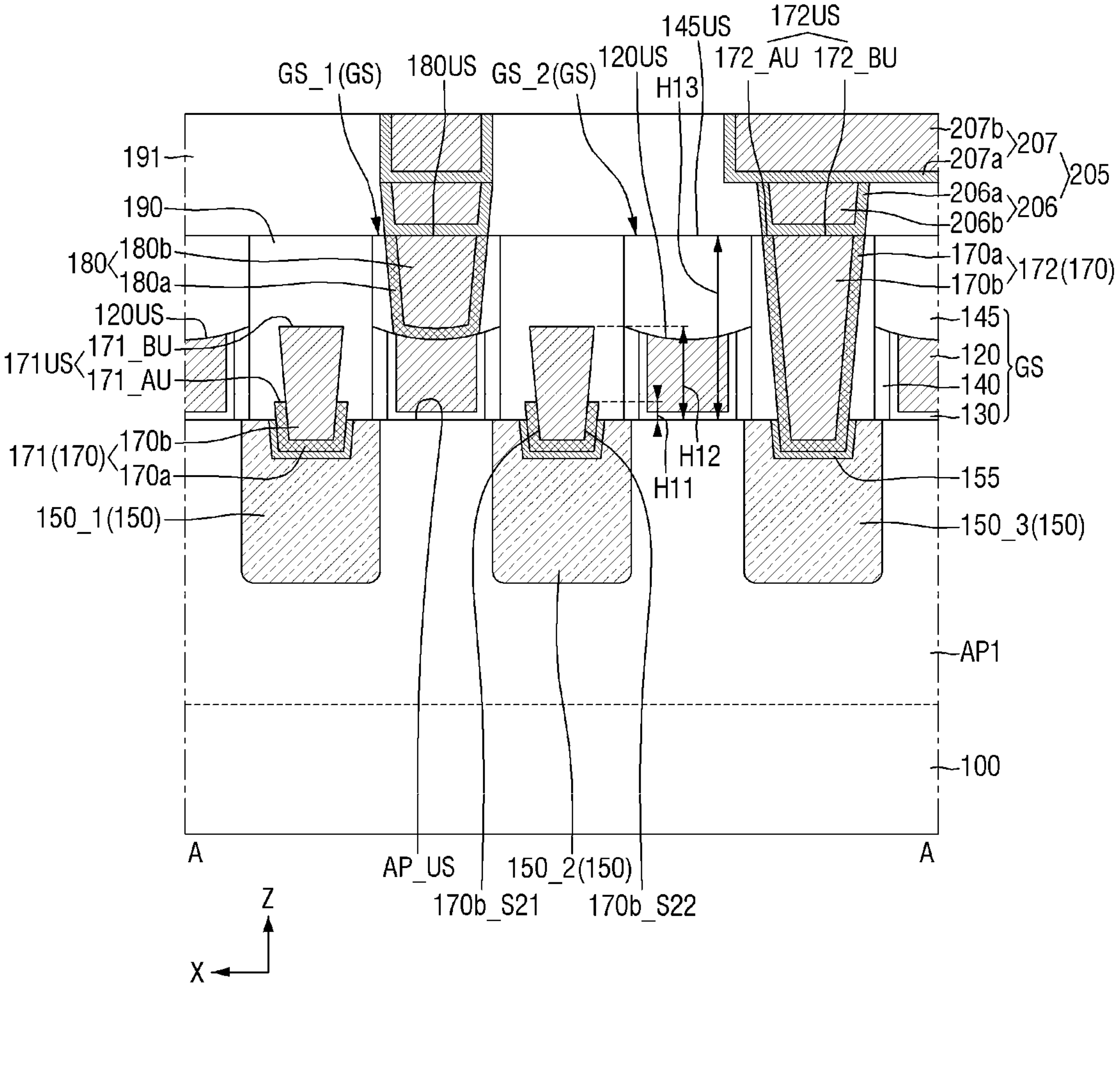
FIG. 8 is a cross-sectional view of a semiconductor device according to some embodiments of the present disclosure.

FIG. 6 is a cross-sectional view of a semiconductor device according to some embodiments of the present disclosure. FIG. 7 is a cross-sectional view of a semiconductor device according to some embodiments of the present disclosure. FIG. 8 is a cross-sectional view of a semiconductor device according to some embodiments of the present disclosure. For convenience, the semiconductor devices of FIGS. 6 through 8 will hereinafter be described, focusing mainly on the differences with the semiconductor device of FIGS. 1 through 5B.

Referring to FIG. 6, the semiconductor device according to some embodiments of the present disclosure may further include first airgaps AG1, which are disposed between first source/drain contacts 170 and gate structures GS.

The first airgaps AG1 may be disposed between first portions 171 of the first source/drain contacts 170 and the gate structures GS. For example, the first airgaps AG1 may be disposed between the first portions 171 of the first source/drain contacts 170 and the gate structures GS. The first airgaps AG1 may be disposed on parts of (e.g., extending at least partially along) sidewalls (170*b*_S21 and 170*b*_S22) of first source/drain filling films 170*b* that protrude beyond top surfaces 171_AU of first partial barrier films.

The first airgaps AG1 may be disposed between the top surfaces 171_AU of the first partial barrier films and top surfaces 171_BU of first partial filling films. For example, the first airgaps AG1 may be generally surrounded by a first interlayer insulating film 190. In another example, the first airgaps AG1 may be surrounded by the first interlayer insulating film 190 and the first source/drain filling films 170*b*.

Referring to FIG. 7, the height of top surfaces 171US of first portions 171 of first source/drain contacts 170 may be the same as the height of top surfaces 120US of gate electrodes 120 with respect to top surfaces AP_US of first active patterns AP1.

Top surfaces 171_BU of first partial filling films may be placed at the same height as the top surfaces 120US of the gate electrodes 120 with respect to the top surfaces AP_US of the first active patterns AP1. The height from the top surfaces AP_US of the first active patterns AP1 to the top surfaces 120US of the gate electrodes 120 may be the same as a height H12 from the top surfaces AP_US of the first active patterns AP1 to the top surfaces 171_BU of the first partial filling films.

Referring to FIG. 8, top surfaces 171US of first portions 171 of first source/drain contacts 170 may be higher than top surfaces 120US of gate electrodes 120 with respect to top surfaces AP_US of first active patterns AP1.

Top surfaces 171_BU of first partial filling films may higher than the top surfaces 120US of the gate electrodes 120 with respect to the top surfaces AP_US of the first active patterns AP1. The height from the top surfaces AP_US of the first active patterns AP1 to the top surfaces 120US of the gate electrodes 120 may be less than a height H12 from the top surfaces AP_US of the first active patterns AP1 to the top surfaces 171_BU of the first partial filling films.

Figure 10:
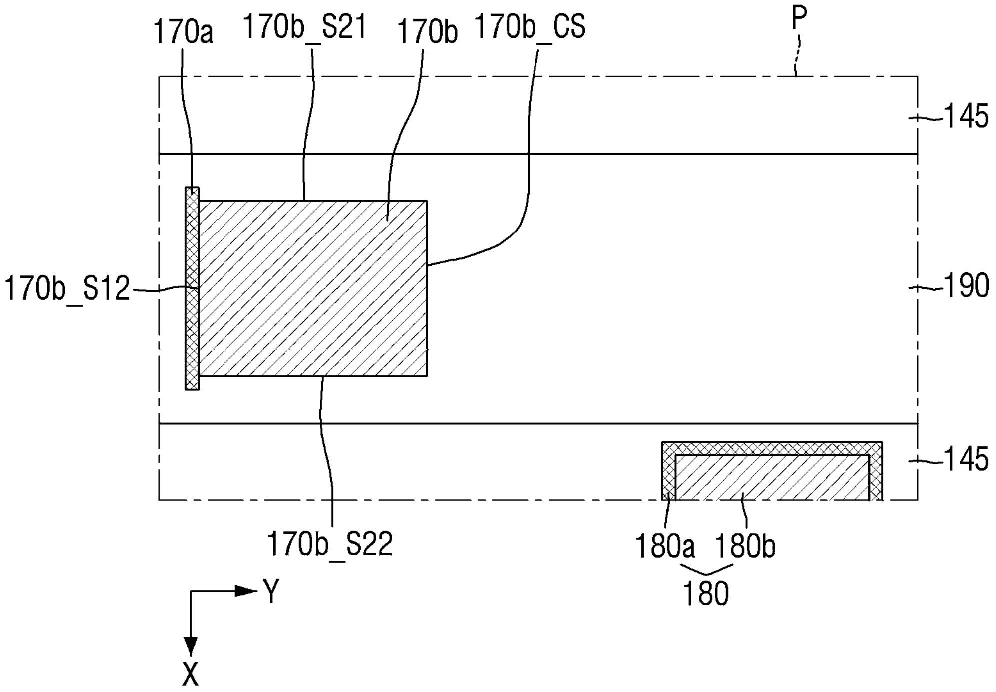

FIGS. 9 and 10 are cross-sectional views of a semiconductor device according to some embodiments of the present disclosure. For convenience, the semiconductor device of FIGS. 9 and 10 will hereinafter be described, focusing mainly on the differences with the semiconductor device of FIGS. 1 through 5B. FIG. 9 is a cross-sectional view taken along line A-A of FIG. 1, and FIG. 10 is a plan view of part P of FIG. 1.

Referring to FIGS. 9 and 10, top surfaces 172_BU of second partial filling films may be higher than top surfaces 172_AU of second partial barrier films with respect to top surfaces AP_US of first active patterns AP1.

In second portions 172 of first source/drain contacts 170, the height from the top surfaces AP_US of the first active patterns AP1 to the top surfaces 172_AU of the second partial barrier films may be less than a height H13 from the top surfaces AP_US of the first active patterns AP1 to the top surfaces 172_BU of the second partial filling films.

The height from the top surfaces AP_US of the first active patterns AP1 to top surfaces 145US of gate structures GS may be the same as the height H13 from the top surfaces AP_US of the first active patterns AP1 to the top surfaces 172_BU of the second partial filling films.

In the second portions 172 of the first source/drain contacts 170, the top surfaces 172_AU of the second partial barrier films may be higher than the top surfaces AP_US of the first active patterns AP1 and lower than the top surfaces 120US of the gate electrodes 120. Alternatively, the top surfaces 172_AU of the second partial barrier films may be higher than the top surfaces 120US of the gate electrodes 120 and lower than the top surfaces 145US of the gate structure GS.

Referring to FIG. 10, in the second portions 172 of the first source/drain contacts 170, first source/drain barrier films 170*a* may generally cover sidewalls 170*b*_S12 of first source/drain filling films 170*b*. The first source/drain barrier films 170*a* do not cover sidewalls 170*b*_S21 and sidewalls 170*b*_S22 of the first source/drain filling films 170*b*.

Figure 11:
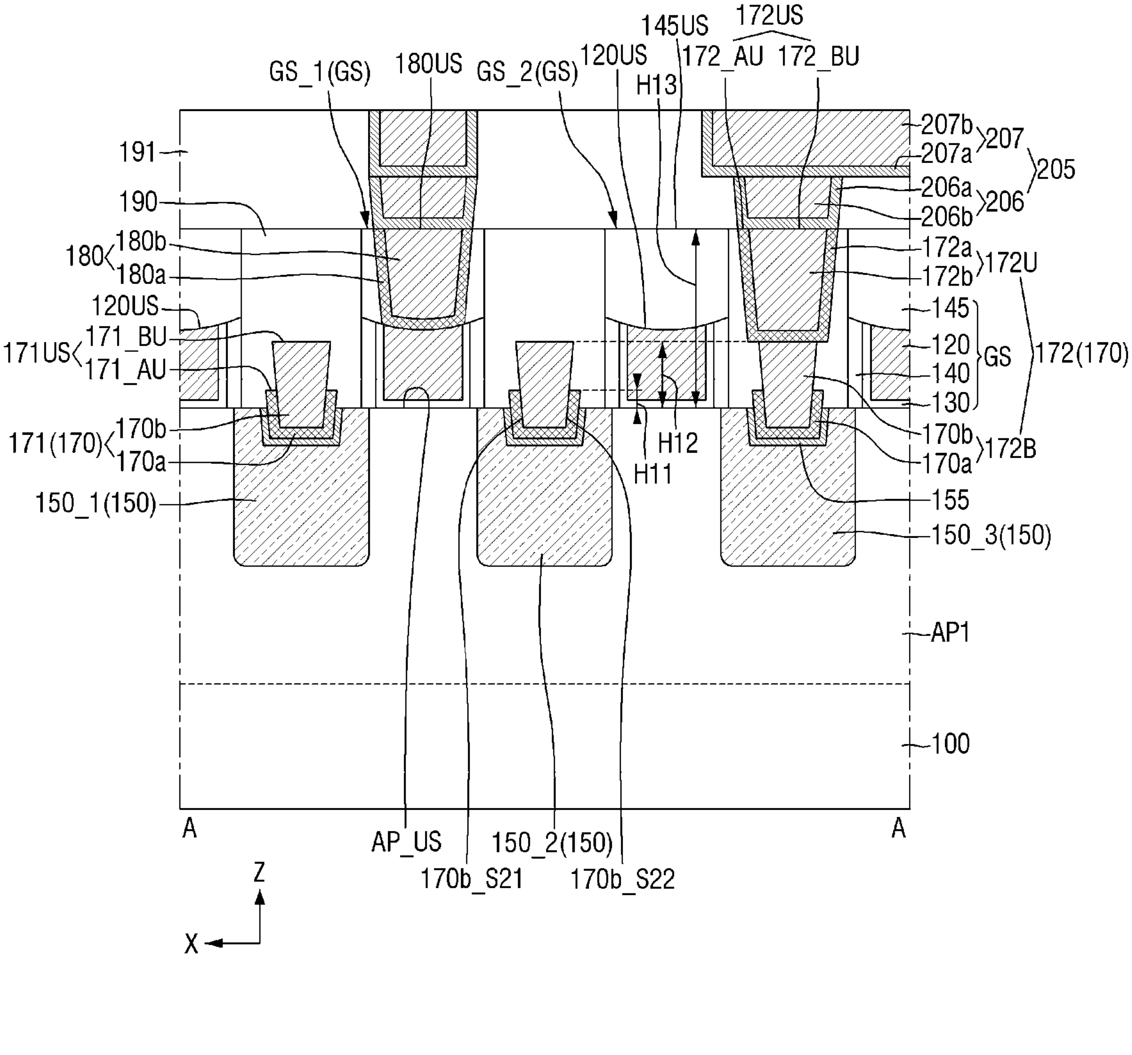
FIGS. 11 and 12 are cross-sectional views of a semiconductor device according to some embodiments of the present disclosure.
Figure 12:
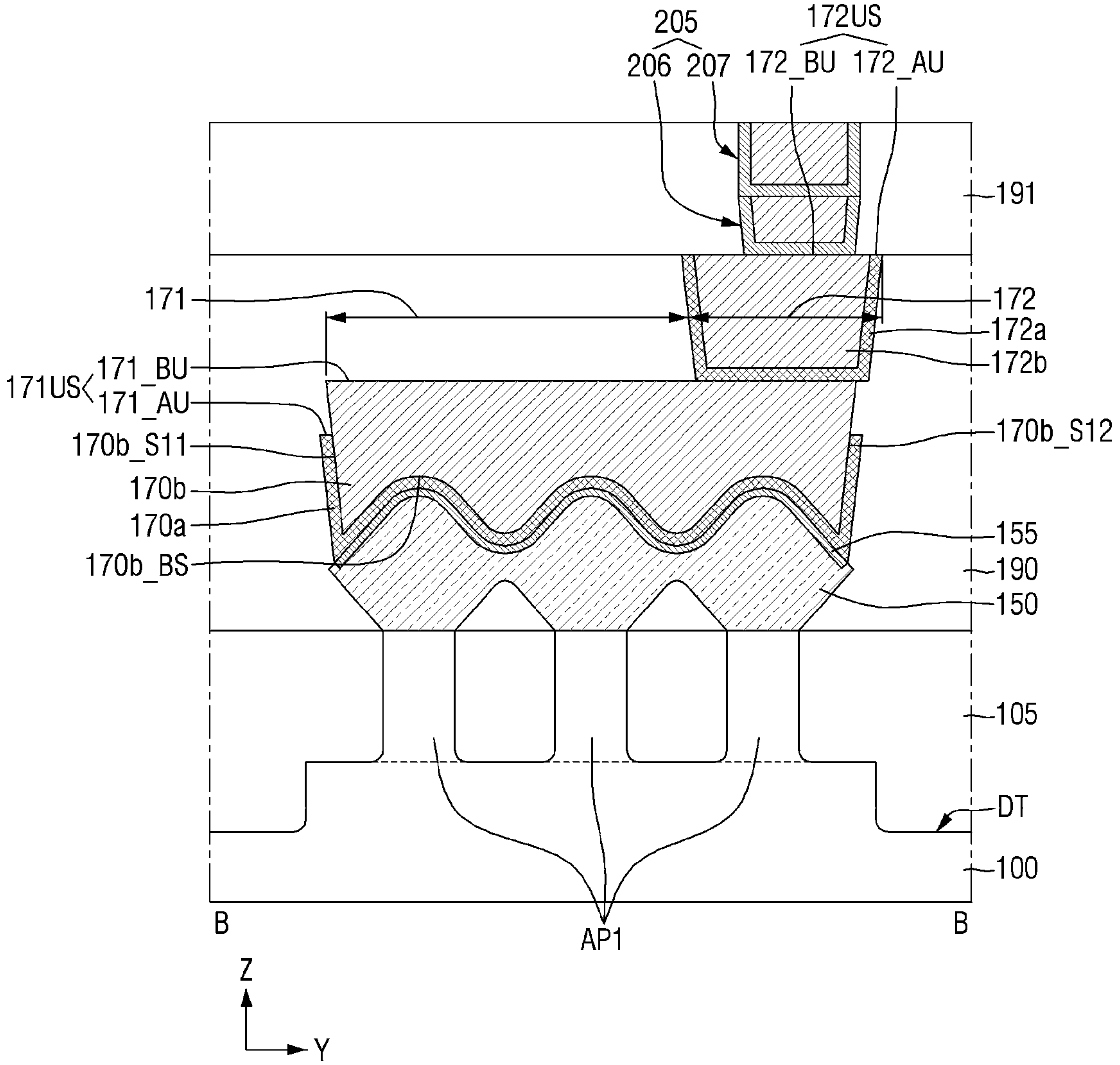

FIGS. 11 and 12 are cross-sectional views of a semiconductor device according to some embodiments of the present disclosure. For convenience, the semiconductor device of FIGS. 11 and 12 will hereinafter be described, focusing mainly on the differences with the semiconductor device of FIGS. 1 through 5B. FIG. 11 is a cross-sectional view taken along line A-A of FIG. 1, and FIG. 12 is a cross-sectional view taken along line B-B of FIG. 1.

Referring to FIGS. 11 and 12, second portions 172 of first source/drain contacts 170 may include lower source/drain contacts 172B and upper source/drain contacts 172U.

The lower source/drain contacts 172B may include first source/drain barrier films 170*a* and first source/drain filling films 170*b*.

For example, in the lower source/drain contacts 172B, the top surfaces of the first source/drain barrier films 170*a* may be lower than top surfaces of the first source/drain filling films 170*b* with respect to the top surfaces AP_US of first active patterns AP1. In the lower source/drain contacts 172B, a height H11 from the top surfaces AP_US of the first active patterns AP1 to the top surfaces of the first source/drain barrier films 170*a* may be less than a height H12 from the top surfaces AP_US of the first active patterns AP1 to the top surfaces of the first source/drain filling films 170*b*.

First source/drain filling films 170*b* of first portions 171 of the first source/drain contacts 170 may be continuous or unitary to the first source/drain filling films 170*b* of the lower source/drain contacts 172B.

For example, the lower source/drain contacts 172B and the first portions 171 of the first source/drain contacts 170 may be formed at the same time. That is, the lower source/drain contacts 172B may be substantially the same as the first portions 171 of the first source/drain contacts 170, and thus, a detailed description thereof will be omitted.

The upper source/drain contacts 172U may be disposed on the lower source/drain contacts 172B. The upper source/drain contacts 172U may include second source/drain barrier films 172*a* and second source/drain filling films 172*b*.

The second source/drain filling films 172*b* may be disposed on the second source/drain barrier films 172*a*. For example, the second source/drain barrier films 172*a* may extend along the sidewalls and bottom surfaces of the second source/drain filling films 172*b*.

Top surfaces 172US of the second portions 172 of the first source/drain contacts 170 may be defined by the upper source/drain contacts 172U. The top surfaces 172US of the second portions 172 of the first source/drain contacts 170 may be defined by the second source/drain barrier films 172*a* and the second source/drain filling films 172*b*.

The materials of the second source/drain barrier films 172*a* and the second source/drain filling films 172*b* may be substantially the same as the materials of the first source/drain barrier films 170*a* and the first source/drain filling films 170*b*.

Wiring structures 205 may be connected to the upper source/drain contacts 172U.

Figure 13:
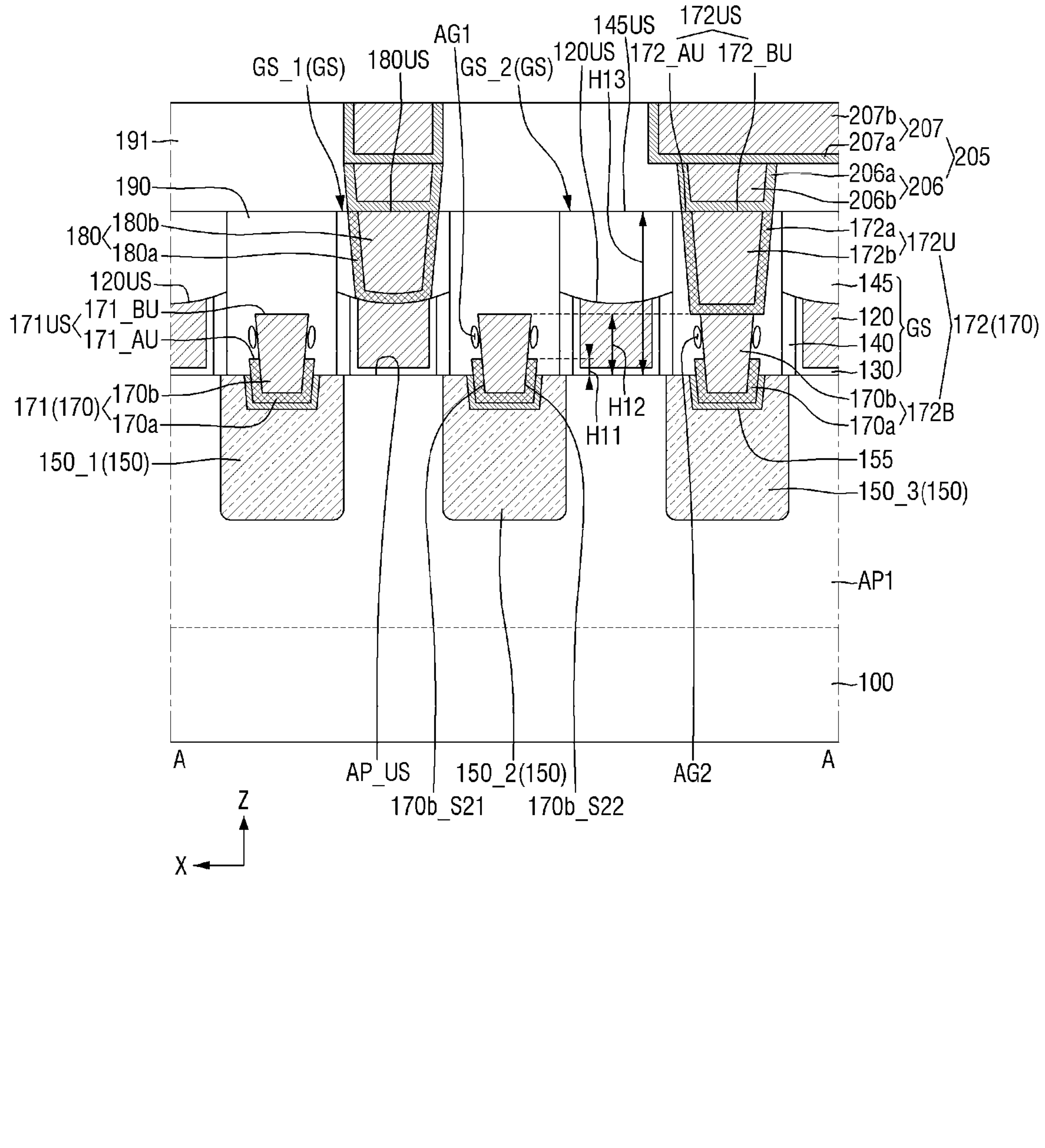
FIG. 13 is a cross-sectional view of a semiconductor device according to some embodiments of the present disclosure.
Figure 14:
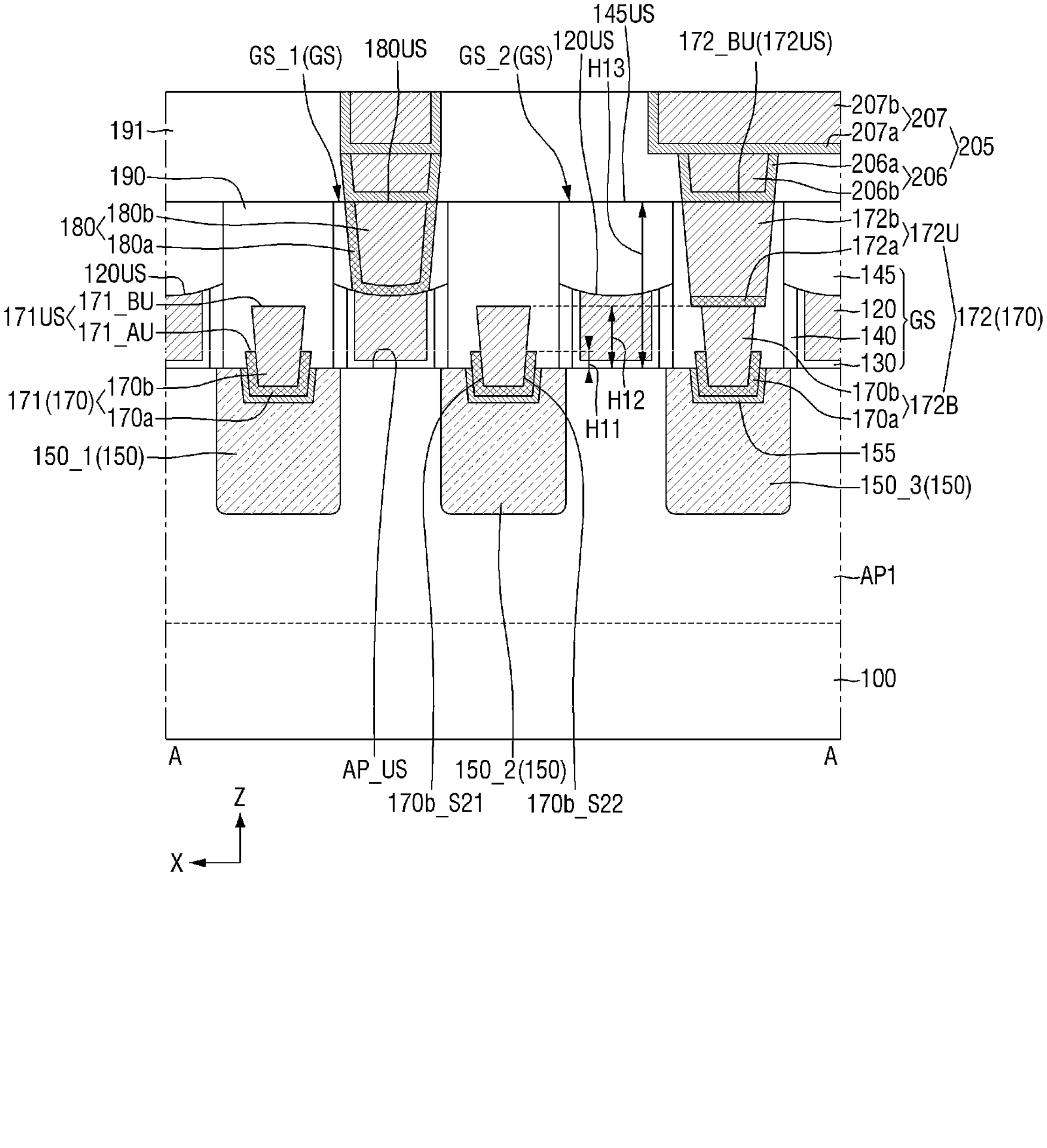
FIG. 14 is a cross-sectional view of a semiconductor device according to some embodiments of the present disclosure.

FIG. 13 is a cross-sectional view of a semiconductor device according to some embodiments of the present disclosure. FIG. 14 is a cross-sectional view of a semiconductor device according to some embodiments of the present disclosure. For convenience, the semiconductor devices of FIGS. 13 and 14 will hereinafter be described, focusing mainly on the differences with the semiconductor device of FIGS. 11 and 12.

Referring to FIG. 13, the semiconductor device according to some embodiments of the present disclosure may further include first airgaps AG1 and second airgaps AG2.

The first airgaps AG1 may be disposed between first portions 171 of first source/drain contacts 170 and gate structures GS. The second airgaps AG2 may be disposed between lower source/drain contacts 172B and the gate structures GS.

The first airgaps AG1 and the second airgaps AG2 may be substantially the same as the first airgaps AG1 of FIG. 6.

Referring to FIG. 14, second source/drain barrier films 172*a* may extend along the bottom surfaces of second source/drain filling films 172*b*, but may not be disposed on the sidewalls of the second source/drain filling films 172*b*.

Top surfaces 172US of second portions 172 of first source/drain contacts 170 may be top surfaces 172_BU of second partial filling films defined by the second source/drain filling films 172*b*.

Alternatively, upper source/drain contacts 172U may include only the second source/drain filling films 172*b* without the second source/drain barrier films 172*a*.

Figure 15:
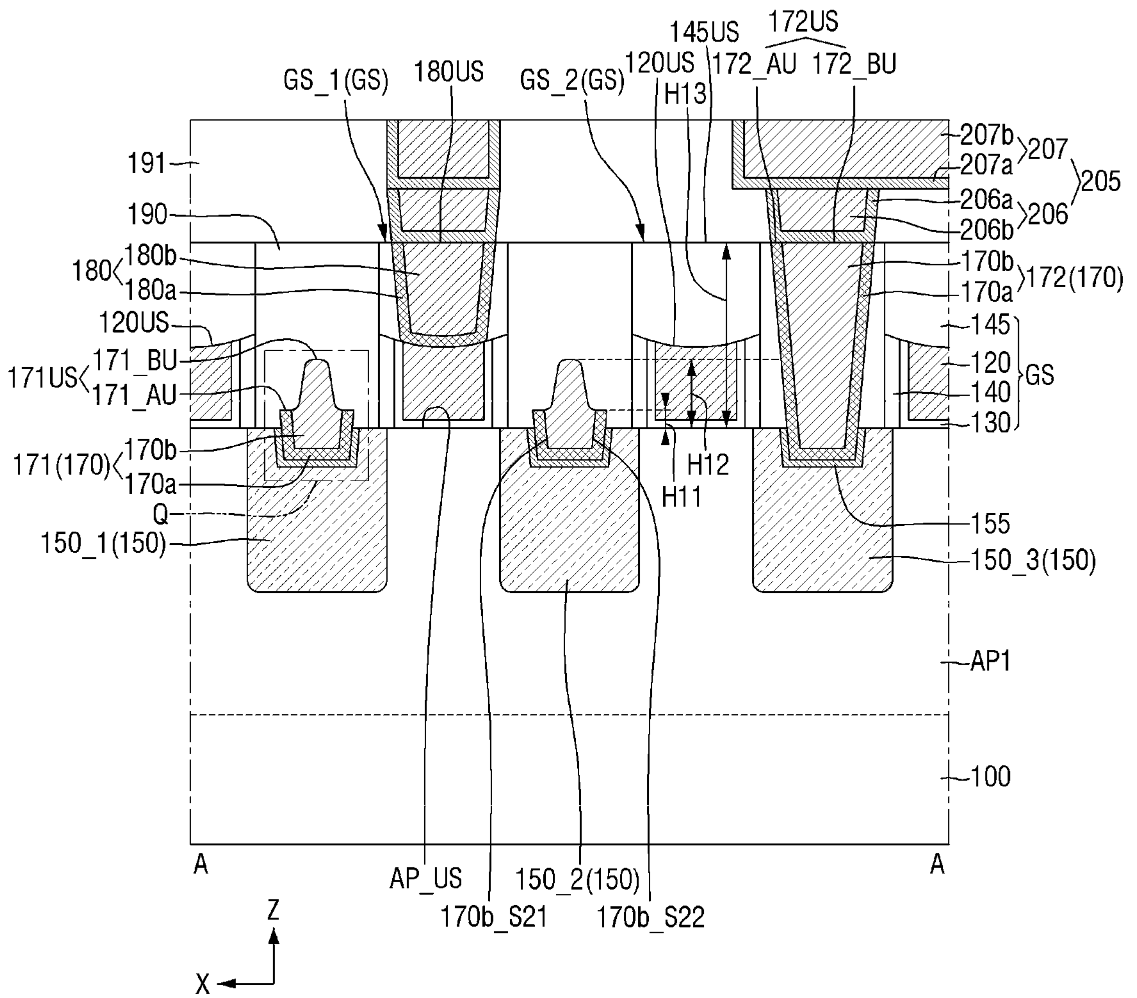
FIGS. 15 and 16 are cross-sectional views of a semiconductor device according to some embodiments of the present disclosure.
Figure 16:
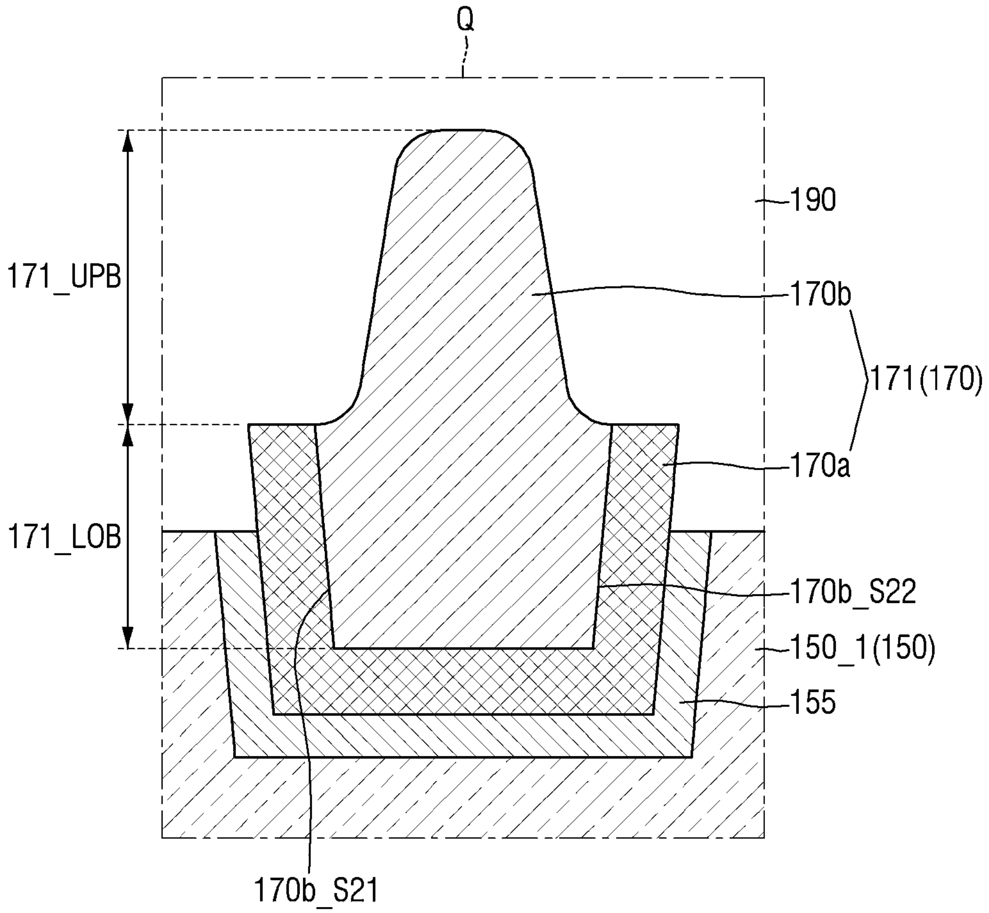

FIGS. 15 and 16 are cross-sectional views of a semiconductor device according to some embodiments of the present disclosure. For convenience, the semiconductor device of FIGS. 15 and 16 will hereinafter be described, focusing mainly on the differences with the semiconductor device of FIGS. 1 through 5B. FIG. 15 is a cross-sectional view taken along line A-A of FIG. 1, and FIG. 16 is an enlarged cross-sectional view of part Q of FIG. 15.

Referring to FIGS. 15 and 16, in first portions 171 of first source/drain contacts 170, first source/drain filling films 170*b* may include lower portions 171_LOB and upper portions 171_UPB.

The lower portions 171_LOB of the first source/drain filling films 170*b* may be parts of the first source/drain filling films 170*b* that are surrounded by first source/drain barrier films 170*a*. The upper portions 171_UPB of the first source/drain filling films 170*b* may be disposed on the lower portions 171_LOB of the first source/drain filling films 170*b*. The upper portions 171_UPB of the first source/drain filling films 170*b* may be parts of the first source/drain filling films 170*b* that protrude upwardly beyond the first source/drain barrier films 170*a*.

For example, the width, in a first direction X, of the upper portions 171_UPB of the first source/drain filling films 170*b* may decrease in a direction (e.g., in the Z-direction) away from source/drain patterns 150.

The top surfaces of the upper portions 171_UPB of the first source/drain filling films 170*b* are illustrated as being flat in part, but the present disclosure is not limited thereto.

FIGS. 17 through 20 are cross-sectional views of semiconductor devices according to some embodiments of the present disclosure. For convenience, the semiconductor devices of FIGS. 17 through 20 will hereinafter be described, focusing mainly on the differences with the semiconductor device of FIGS. 1 through 5B.

Figure 17:
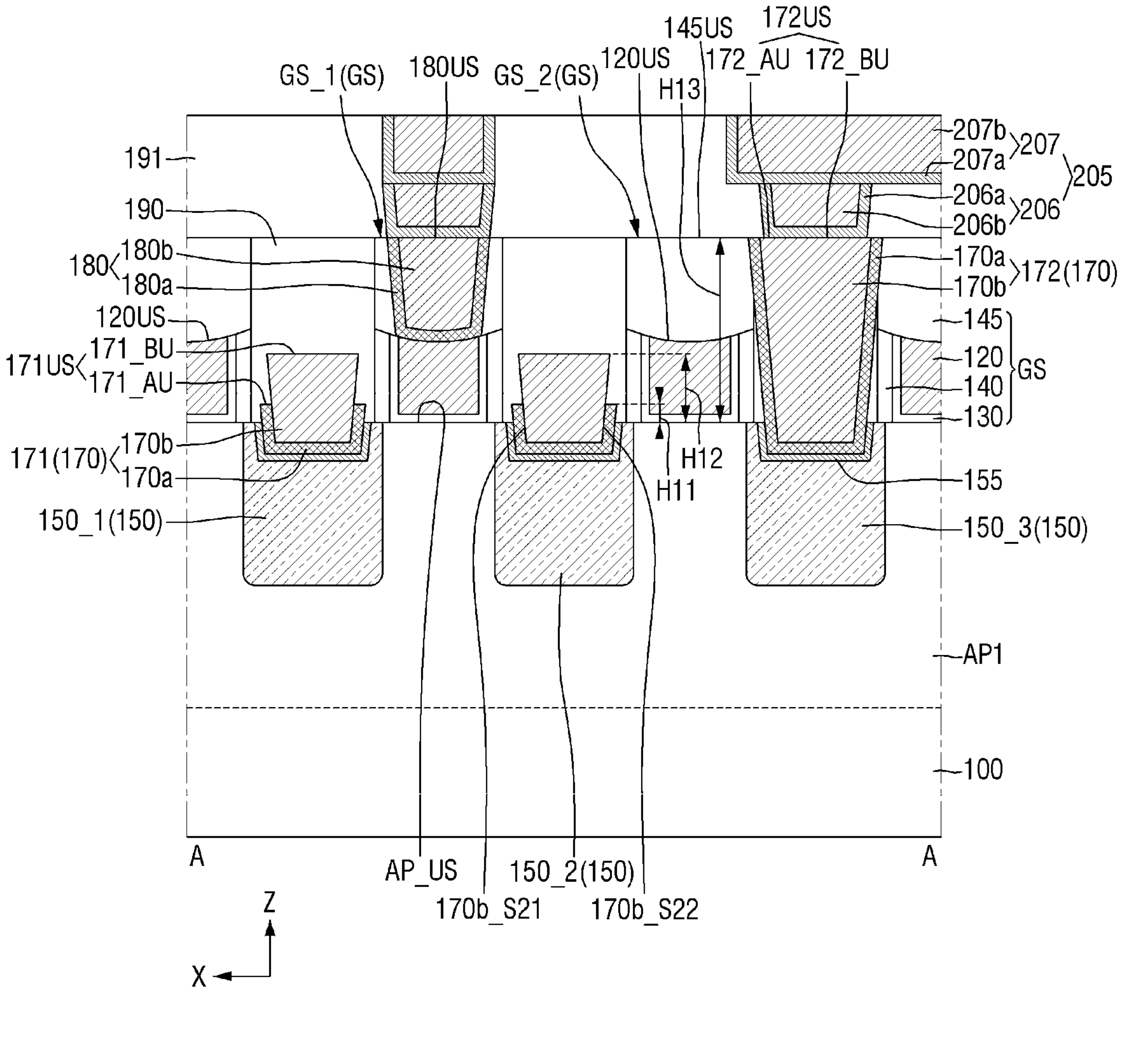
FIGS. 17, 18, 19, and 20 are cross-sectional views of semiconductor devices according to some embodiments of the present disclosure.

Referring to FIG. 17, first source/drain contacts 170 may be in contact with the gate capping patterns 145 of the gate structures GS on opposing sides thereof.

Each of second portions 172 of the first source/drain contacts 170 may be in contact with the gate capping patterns 145 of the gate structures GS adjacent to the corresponding second portion 172 in a first direction X. The first source/drain contacts 170 may be self-aligned between the gate structures GS.

Figure 18:
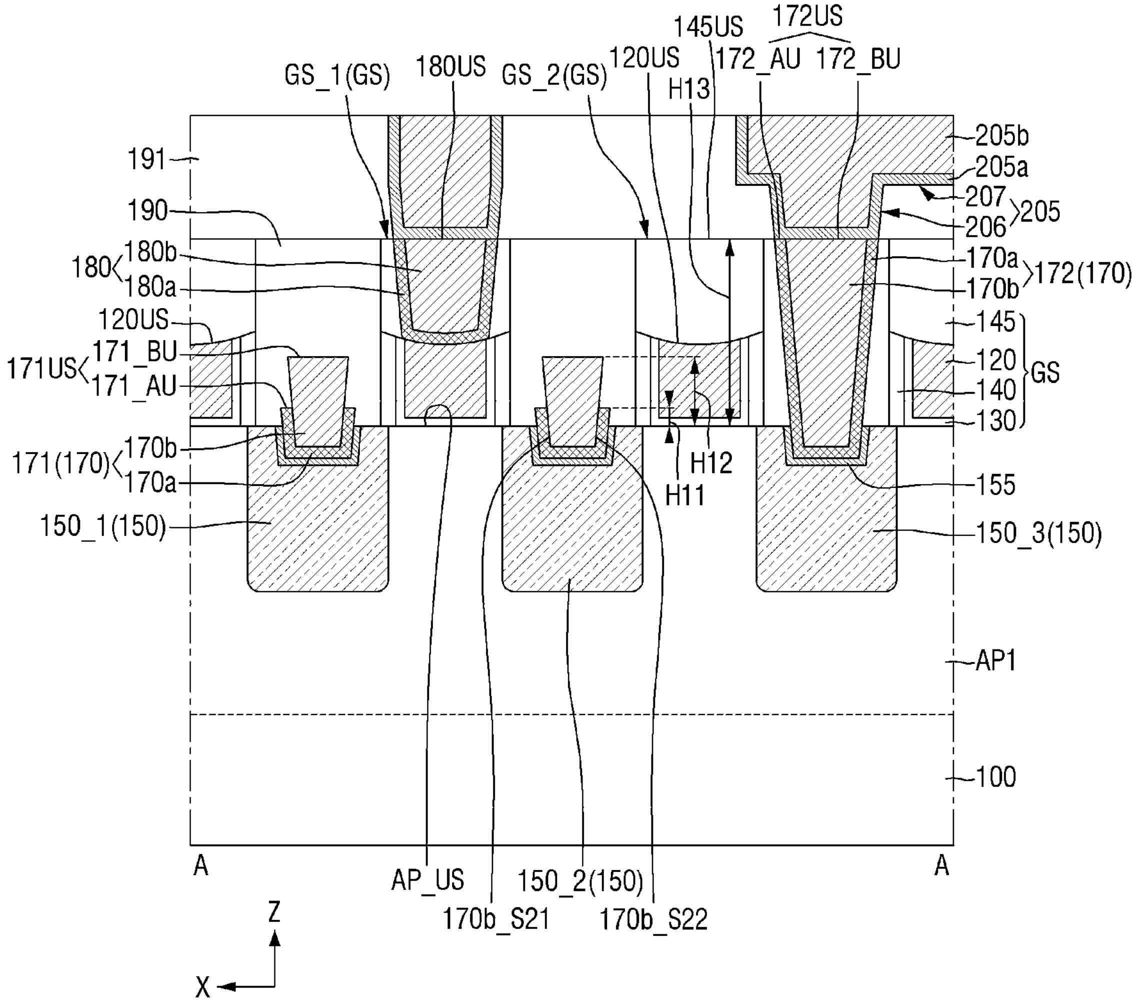

Referring to FIG. 18, wiring structures 205 may include wiring structure barrier films 205*a* and wiring structure filling films 205*b*.

Vias 206 and wiring lines 207 may include wiring structure barrier films 205*a* and wiring structure filling films 205*b*. The wiring structure filling films 205*b* of the vias 206 may be directly connected to or continuous with the wiring structure filling films 205*b* of the wiring lines 207.

Alternatively, the wiring structures 205 may include only the wiring structure filling films 205*b*, which are formed as single films.

Figure 19:
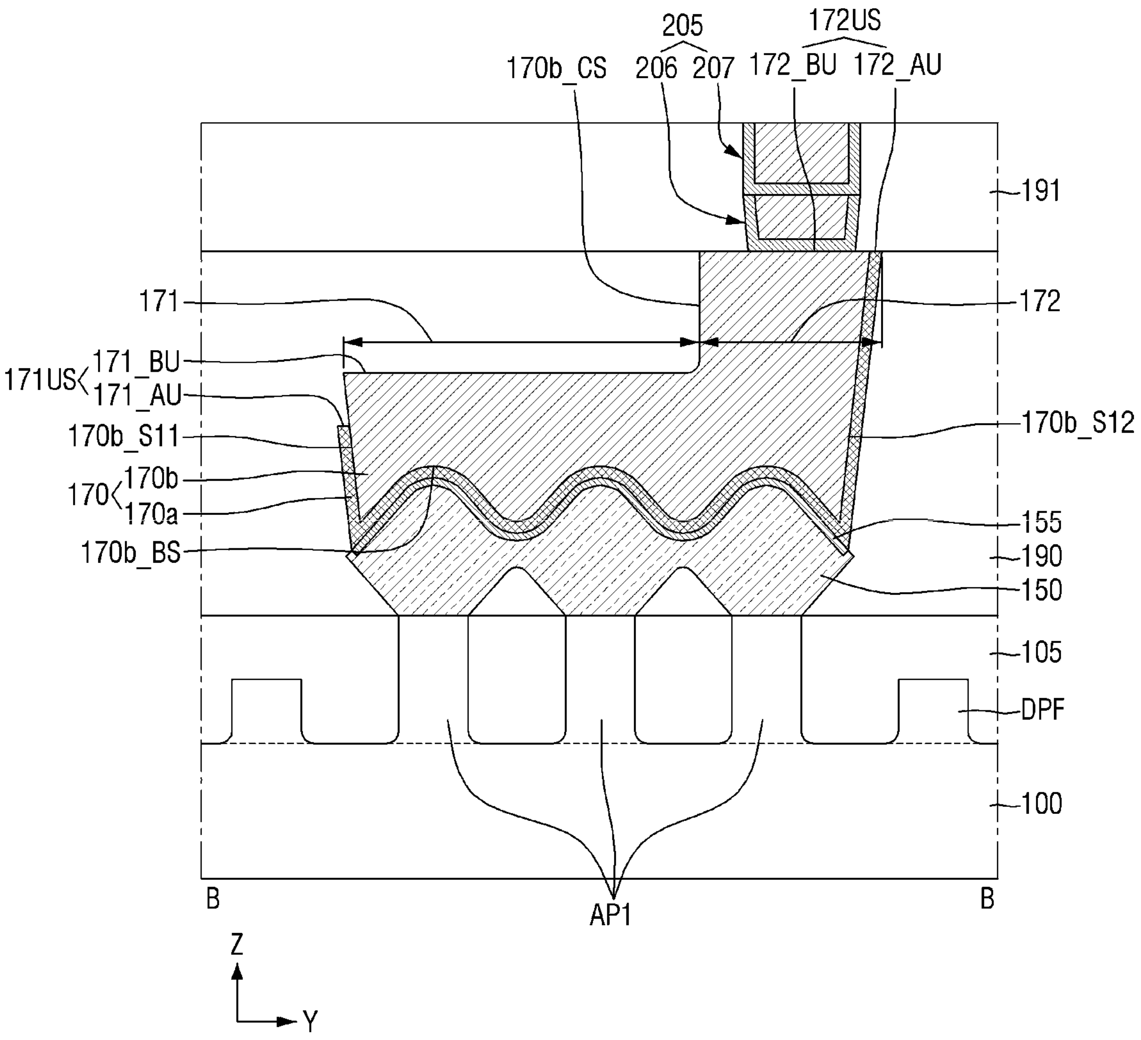

Referring to FIG. 19, the semiconductor device according to some embodiments of the present disclosure may include dummy protruding patterns DPF, which are formed in a field region FX. No deep trenches (DT of FIG. 2) are formed in the field region FX.

The top surfaces of the dummy protruding patterns DPF are covered by a field insulating film 105.

Figure 20:
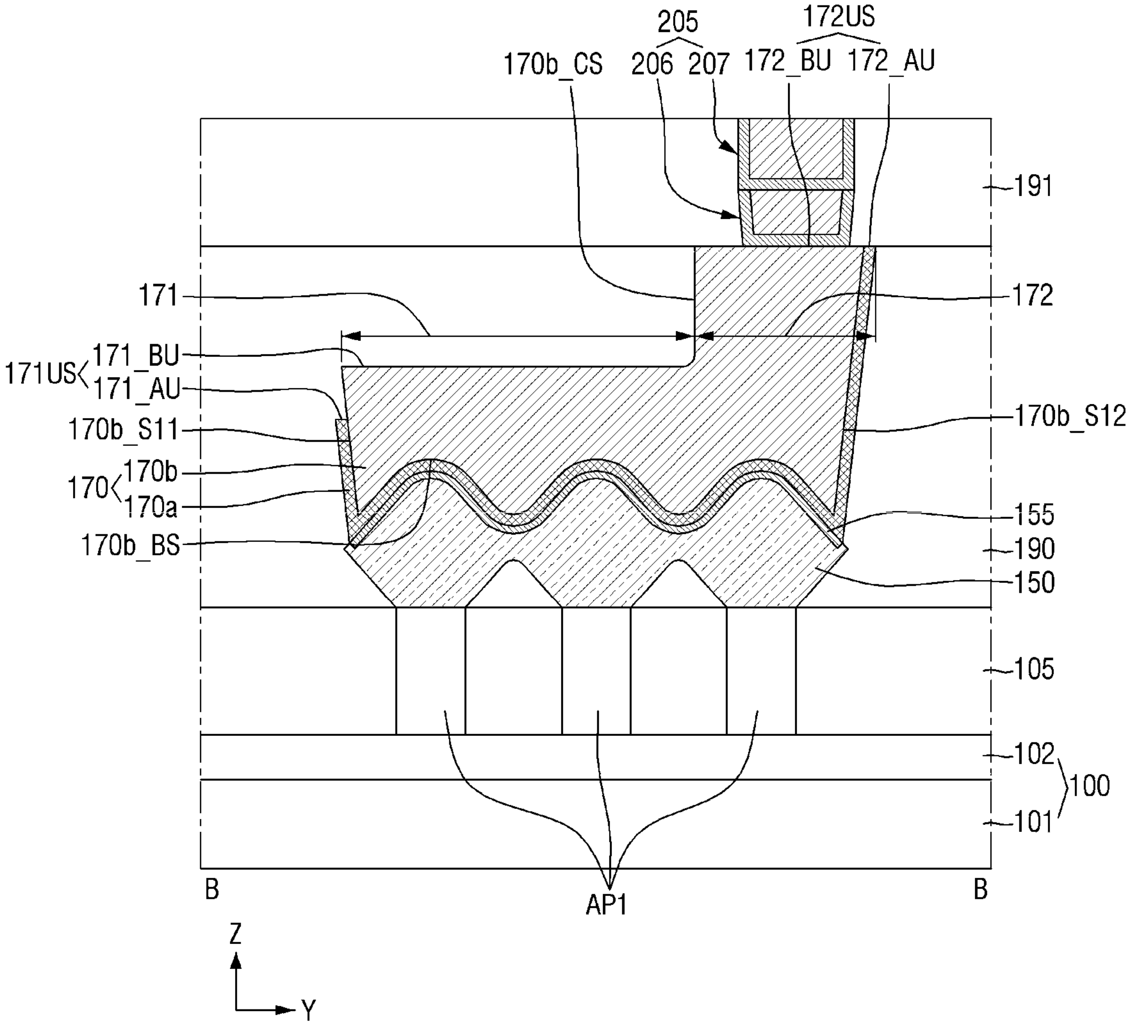

Referring to FIG. 20, a substrate 100 may include a base substrate 101 and a buried insulating film 102 on the base substrate 101.

The base substrate 101 may include a semiconductor material, but the present disclosure is not limited thereto. The buried insulating film 102 may be generally formed along the top surface of the base substrate 102. The buried insulating film 102 may include an insulating material.

Figure 21:
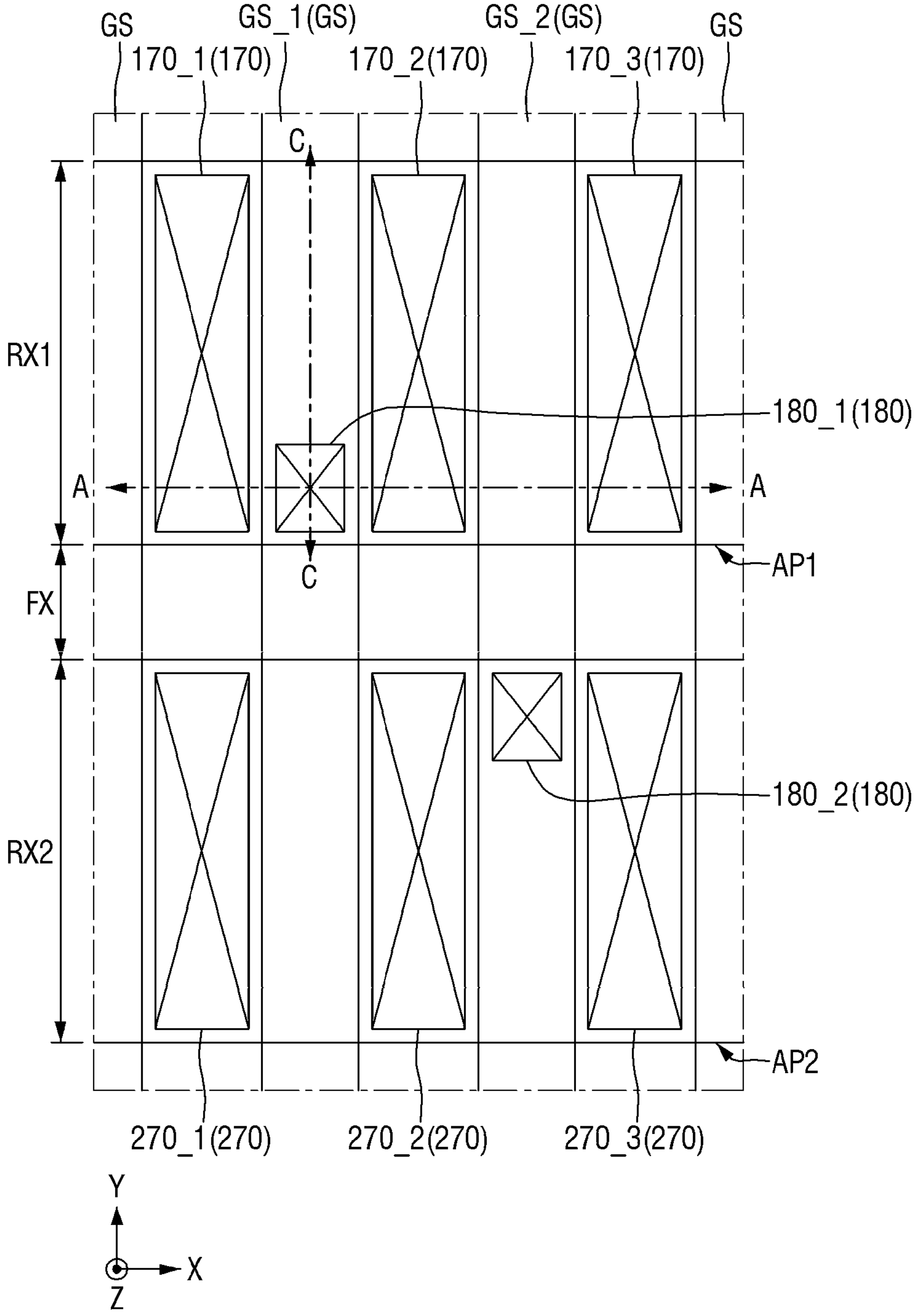
FIGS. 21, 22, 23, and 24 are layout views or cross-sectional views of a semiconductor device according to some embodiments of the present disclosure.
Figure 22:
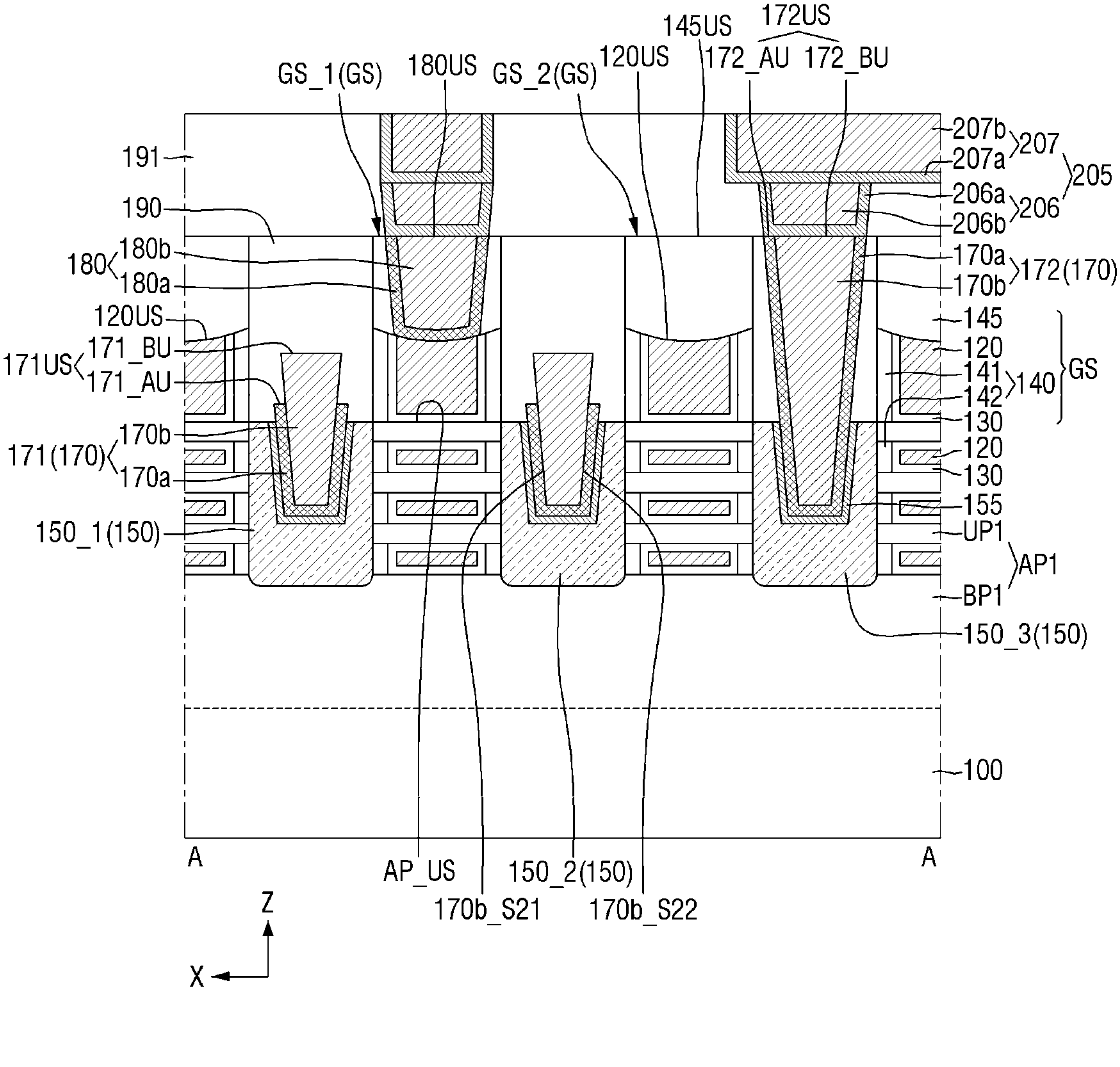
Figure 23:
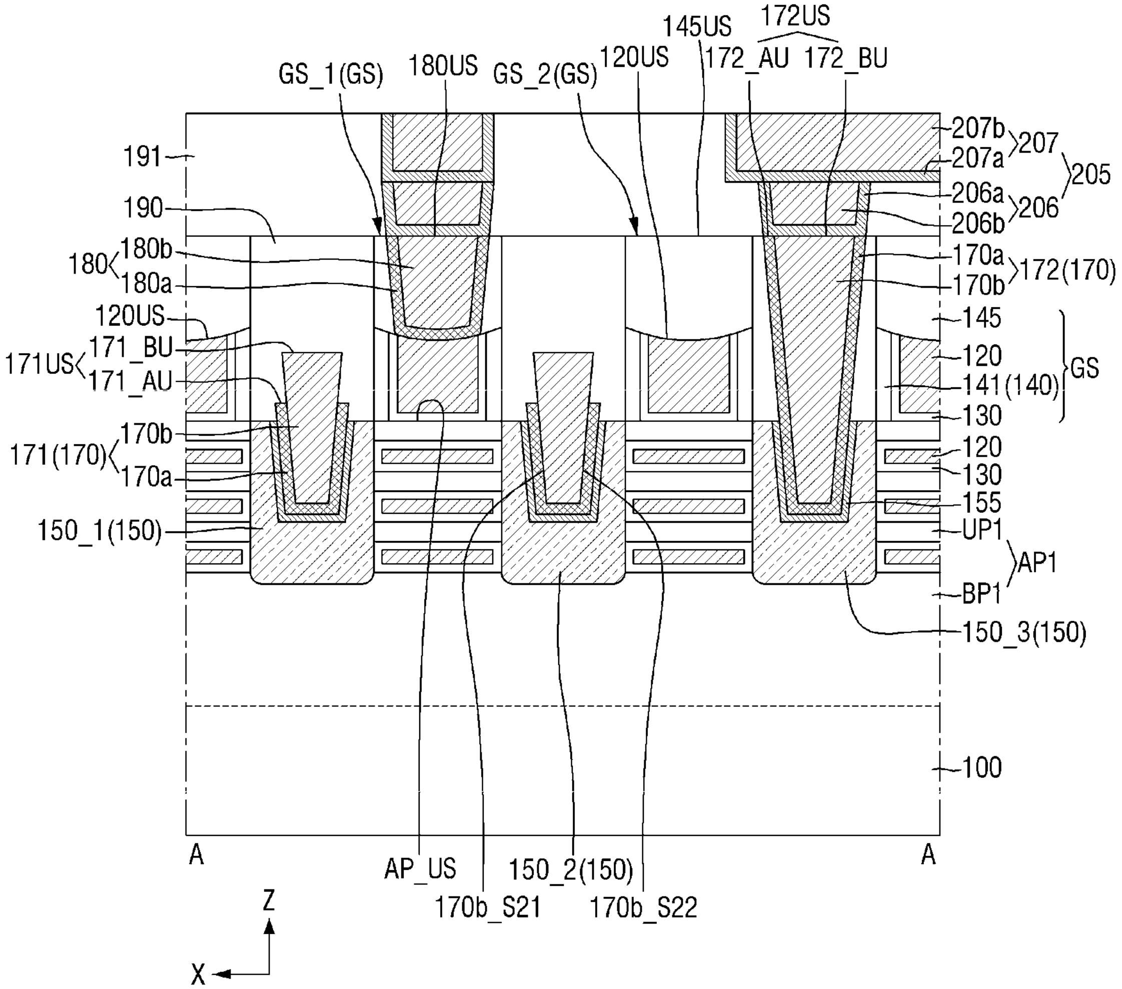
Figure 24:
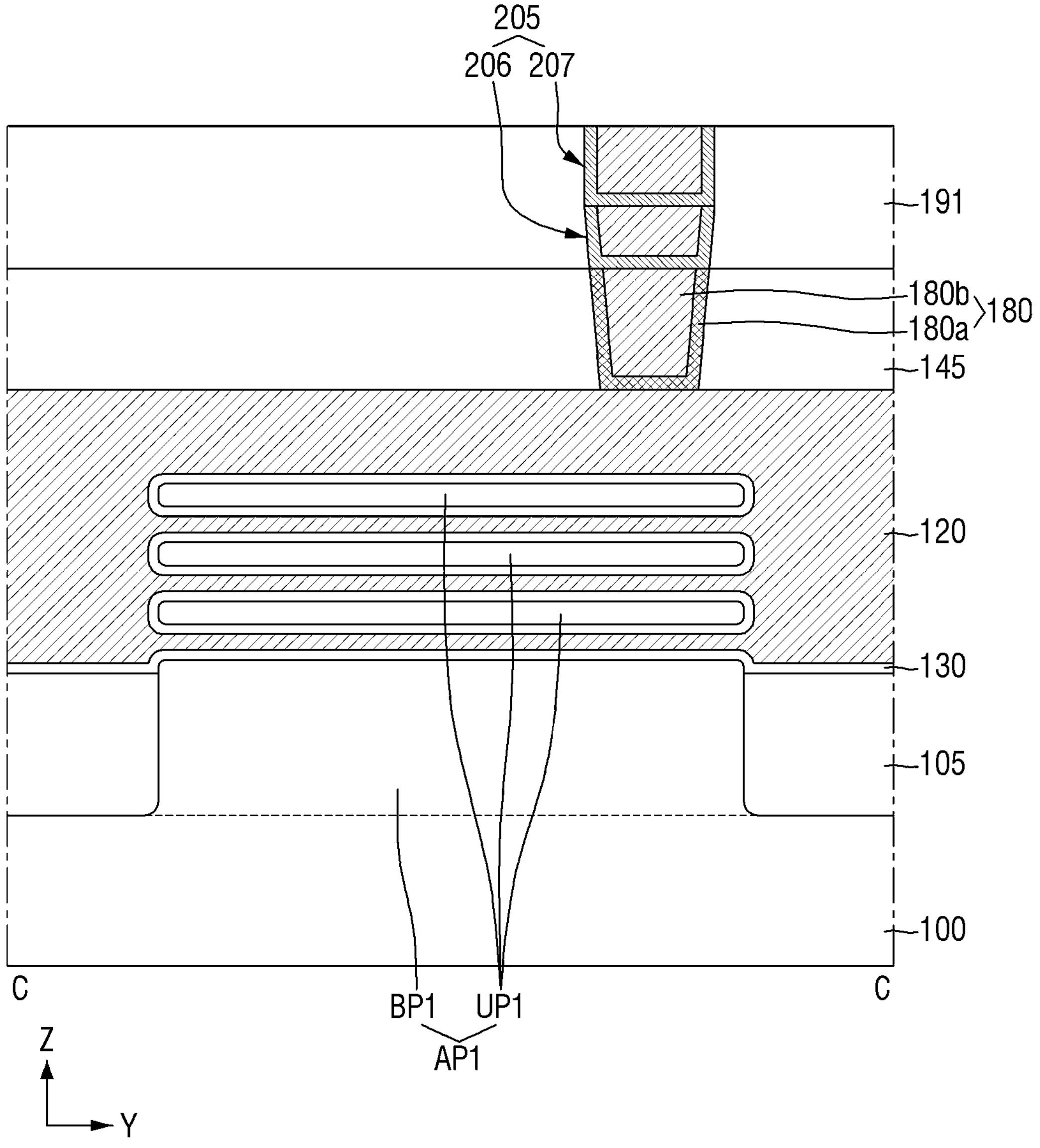

FIGS. 21 through 24 are layout views or cross-sectional views of a semiconductor device according to some embodiments of the present disclosure. FIG. 21 is a layout view of a semiconductor device according to some embodiments of the present disclosure. FIGS. 22 and 23 are cross-sectional views taken along line A-A of FIG. 21. FIG. 24 is a cross-sectional view taken along line C-C of FIG. 21. For convenience, the semiconductor device of FIGS. 21 through 24 will hereinafter be described, focusing mainly on the differences with the semiconductor device of FIGS. 1 through 5B.

Referring to FIGS. 21 through 24, first active patterns AP1 may include lower patterns BP1 and sheet patterns UP1.

Although not specifically illustrated, second active patterns AP2 may include lower patterns and sheet patterns.

The lower patterns BP1 may extend in a first direction X. The sheet patterns UP1 may be disposed on the lower patterns BP1 to be spaced apart from the lower patterns BP1 along the first direction X.

Each of the first active patterns AP1 may include a plurality of sheet patterns UP1. Each of the first active patterns AP1 is illustrated as including three sheet patterns UP1, but the present disclosure is not limited thereto.

The sheet patterns UP1 may be connected to the source/drain patterns 150. The sheet patterns UP1 may be channel patterns that are used as the channel regions of transistors. For example, the sheet patterns UP1 may be nanosheets or nanowires.

Gate insulating films 130 may extend along the top surfaces of the lower patterns BP1 and the top surface of a field insulating film 105. The gate insulating films 130 may surround the sheet patterns UP1.

Gate electrodes 120 are disposed on the lower patterns BP1. The gate electrodes 120 intersect the lower patterns BP1. The gate electrodes 120 may surround the sheet patterns UP1. The gate electrodes 120 may be disposed between the lower patterns BP1 and the sheet patterns UP1 and between the sheet patterns UP1.

Referring to FIG. 22, gate spacers 140 may include outer spacers 141 and inner spacers 142. The inner spacers 142 may be disposed between the lower patterns BP1 and the sheet patterns UP1 and between the sheet patterns UP1.

Referring to FIGS. 23 and 24, the gate spacers 140 may include only the outer spacers 141. No inner spacers may be disposed between the lower patterns BP1 and the sheet patterns UP1 and between the sheet patterns UP1.

The bottom surfaces of first source/drain contacts 170 may be located between the top surfaces of lowermost sheet patterns UP1 and the bottom surfaces of uppermost sheet patterns UP1.

Figure 25:
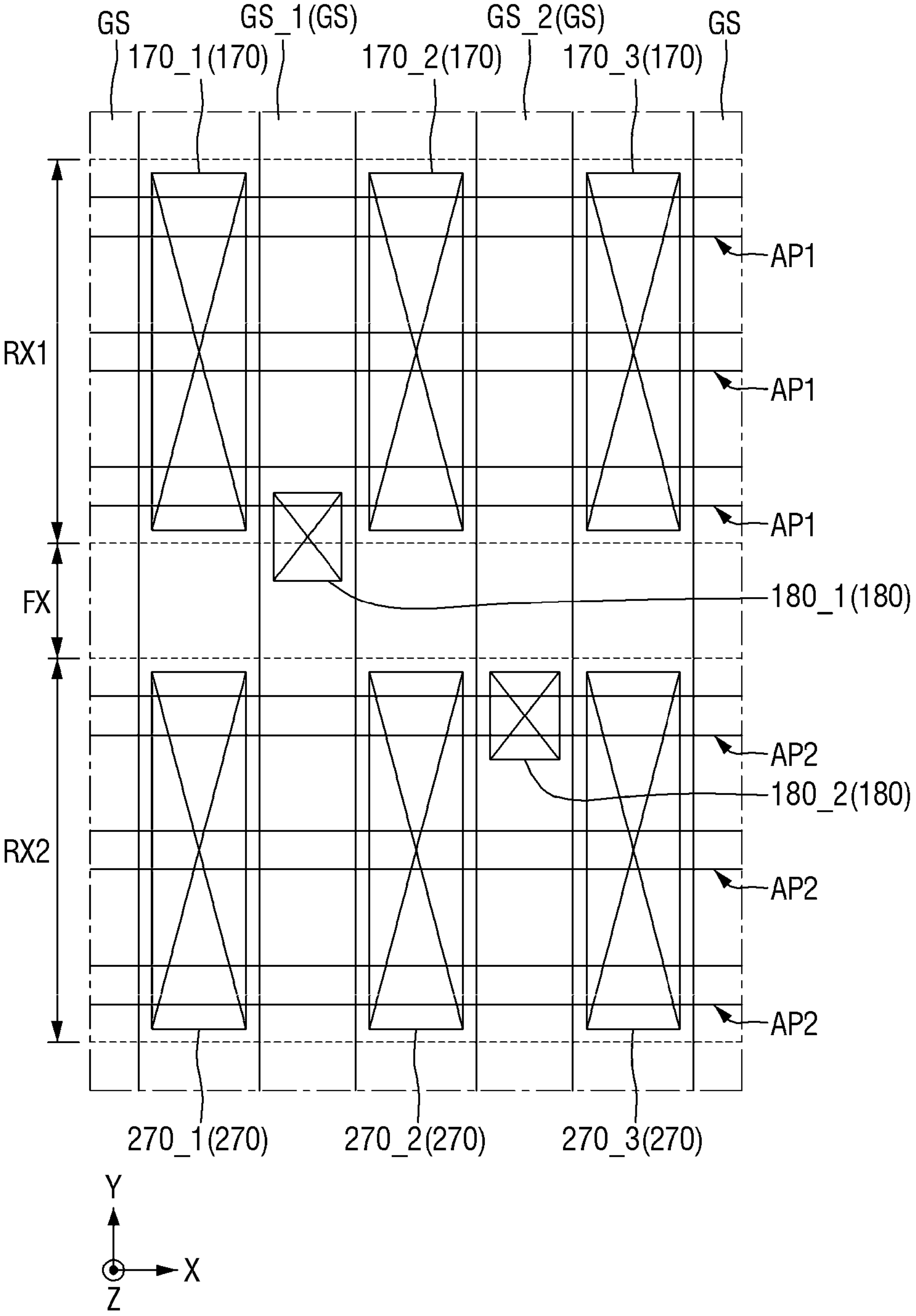
FIGS. 25 and 26 are layout views of semiconductor devices according to some embodiments of the present disclosure.
Figure 26:
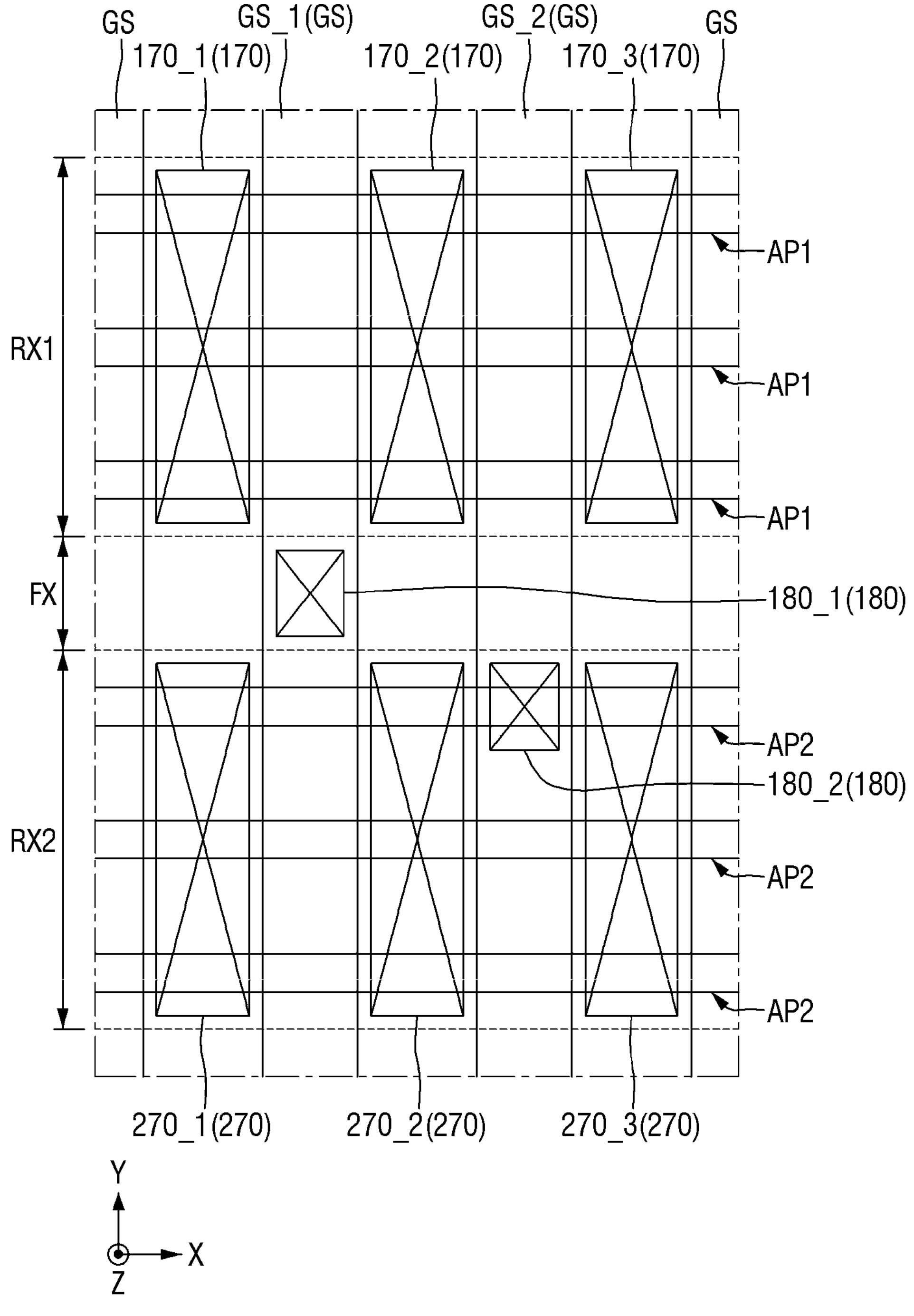

FIGS. 25 and 26 are layout views of semiconductor devices according to some embodiments of the present disclosure. For convenience, the semiconductor devices of FIGS. 25 and 26 will hereinafter be described, focusing mainly on the differences with the semiconductor device of FIGS. 1 through 5B.

Referring to FIG. 25, a first gate contact 180_1 may be disposed in and across a first active region RX1 and a field region FX.

Part of the first gate contact 180_1 may be disposed at a location overlapping with the first active region RX.

Referring to FIG. 26, a first gate contact 180_1 may be disposed generally or entirely in a field region FX.

The first gate contact 180_1 may be disposed generally at a location overlapping with the field region FX.

FIGS. 25 and 26 illustrate a second gate contact 180_2 as being disposed generally in a second active region RX2, but the present disclosure is not limited thereto. Alternatively, part of the second gate contact 1802 may be disposed in and across a field region FX or generally within the field region FX.

Referring to FIGS. 25 and 26 and further to FIG. 1, in a cross-sectional view taken along a second direction Y, first source/drain contacts 170 and second source/drain contacts 270 may have an L shape or an inverted T shape depending on the locations of gate contacts 180.

FIGS. 27 through 31 are cross-sectional views illustrating a method of fabricating a semiconductor device according to some embodiments of the present disclosure. Specifically, FIGS. 27 through 31 are cross-sectional views taken along line A-A of FIG. 1. The method of fabricating a semiconductor device according to some embodiments of the present disclosure will hereinafter be described with reference to FIGS. 27 through 31.

Figure 27:
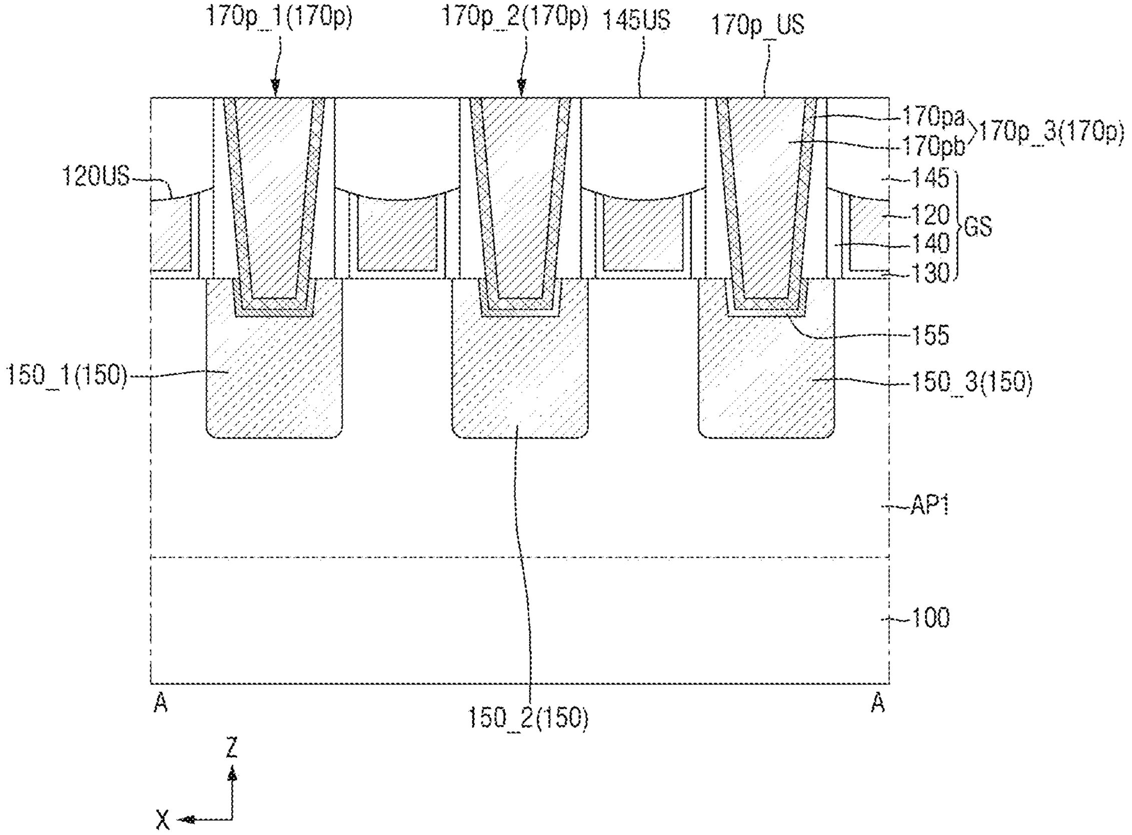
FIGS. 27, 28, 29, 30, and 31 are cross-sectional views illustrating a method of fabricating a semiconductor device according to some embodiments of the present disclosure.

Referring to FIG. 27, source/drain patterns 150 may be disposed between gate structures GS. Pre-source/drain contacts 170*p* may be formed on the source/drain patterns 150.

The pre-source/drain contacts 170*p* may include pre-source/drain barrier films 170*pa* and pre-source/drain filling films 170*pb* on the pre-source/drain barrier films 170*pa*.

Top surfaces 170*p*_US of the pre-source/drain contacts 170*p* may be placed on the same plane as or substantially coplanar with top surfaces 145US of the gate structures GS.

The pre-source/drain contacts 170*p* may be formed in a first interlayer insulating film 190, which is formed on the source/drain patterns 150.

The pre-source/drain contacts 170*p* may include first, second, and third pre-source/drain contacts 170*p*_1, 170*p*_2, and 170*p*_3.

The first pre-source/drain contact 170*p*_1 may be connected to a first source/drain pattern 150_1. The second pre-source/drain contact 170*p*_2 may be connected to a second source/drain pattern 150_2. The third pre-source/drain contact 170*p*_3 may be connected to a third source/drain pattern 150_3.

Figure 28:
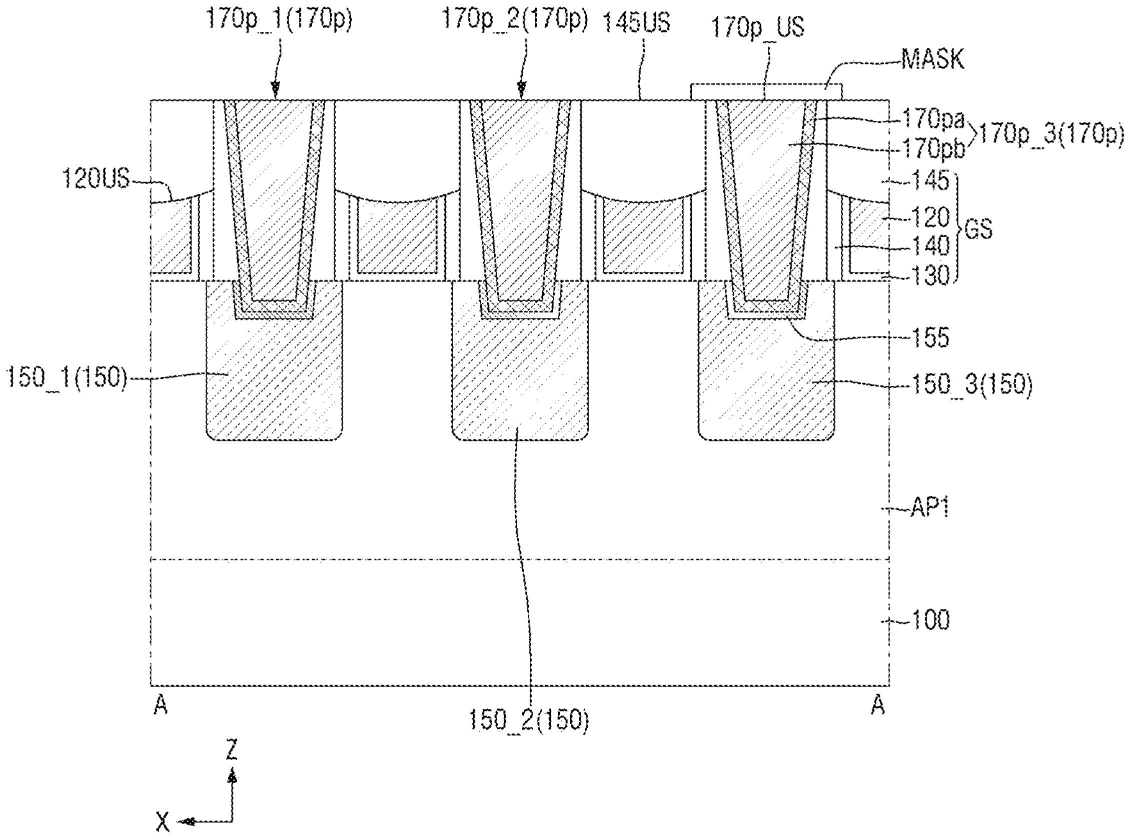

Referring to FIG. 28, a mask pattern MASK may be formed on the third pre-source/drain contact 170*p*_3.

The mask pattern MASK may cover the third pre-source/drain contact 170*p*_3. The first and second pre-source/drain contacts 170*p*_1 and 170*p*_2 may be exposed by the mask pattern MASK.

Figure 29:
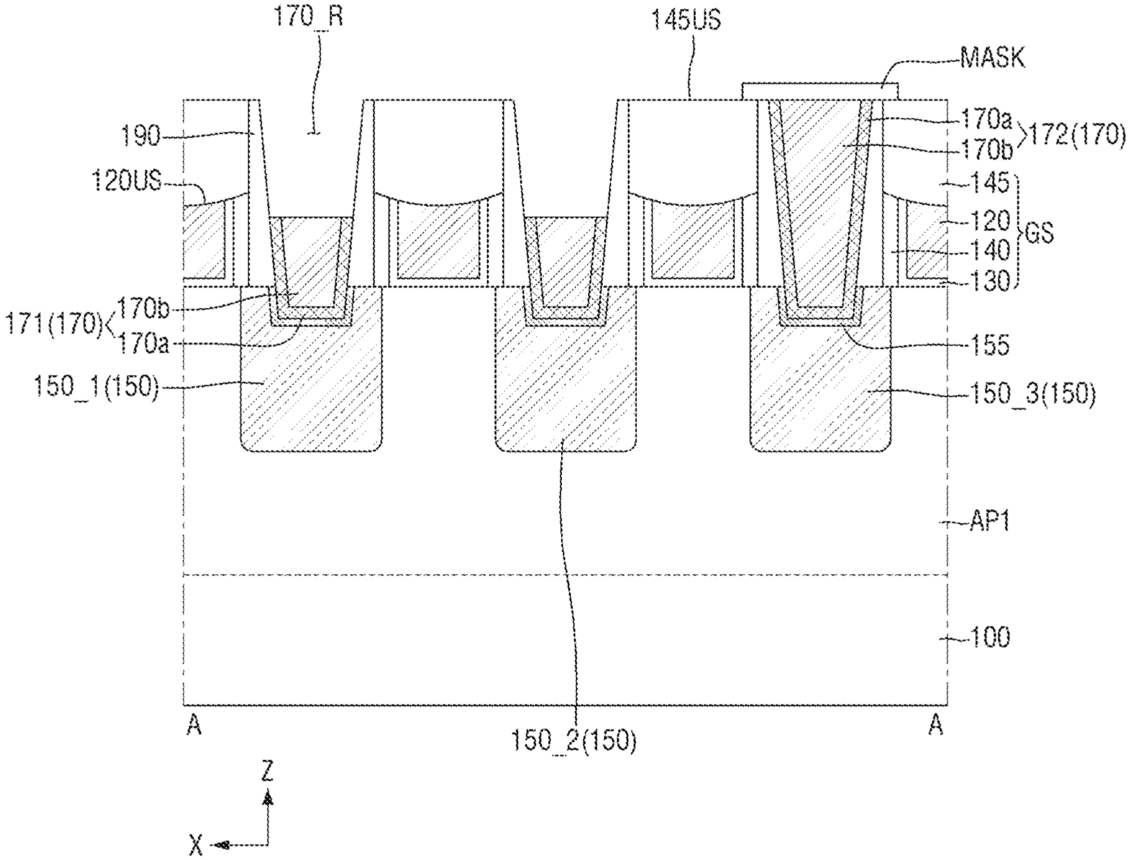

Referring to FIG. 29, parts of the first and second pre-source/drain contacts 170*p*_1 and 170*p*_2 may be removed using the mask pattern MASK.

As parts of the first and second pre-source/drain contacts 170*p*_1 and 170*p*_2 are removed, contact recesses 170_R may be formed in the first interlayer insulating film 190.

As a result, first source/drain contacts 170 may be formed on the first, second, and third source/drain patterns 150_1, 150_2, and 150_3. The first source/drain contacts 170 may include first source/drain barrier films 170*a* and first source/drain filling films 170*b*.

The first source/drain contacts 170 may be formed by removing parts of the pre-source/drain barrier films 170*pa* and the pre-source/drain filling films 170*pb*.

First portions 171 of the first source/drain contacts 170 may be formed on the first and second source/drain patterns 150_1 and 150_2. A second portion 172 of a first source/drain contact 170 may be formed on the third source/drain pattern 150_3.

Figure 30:
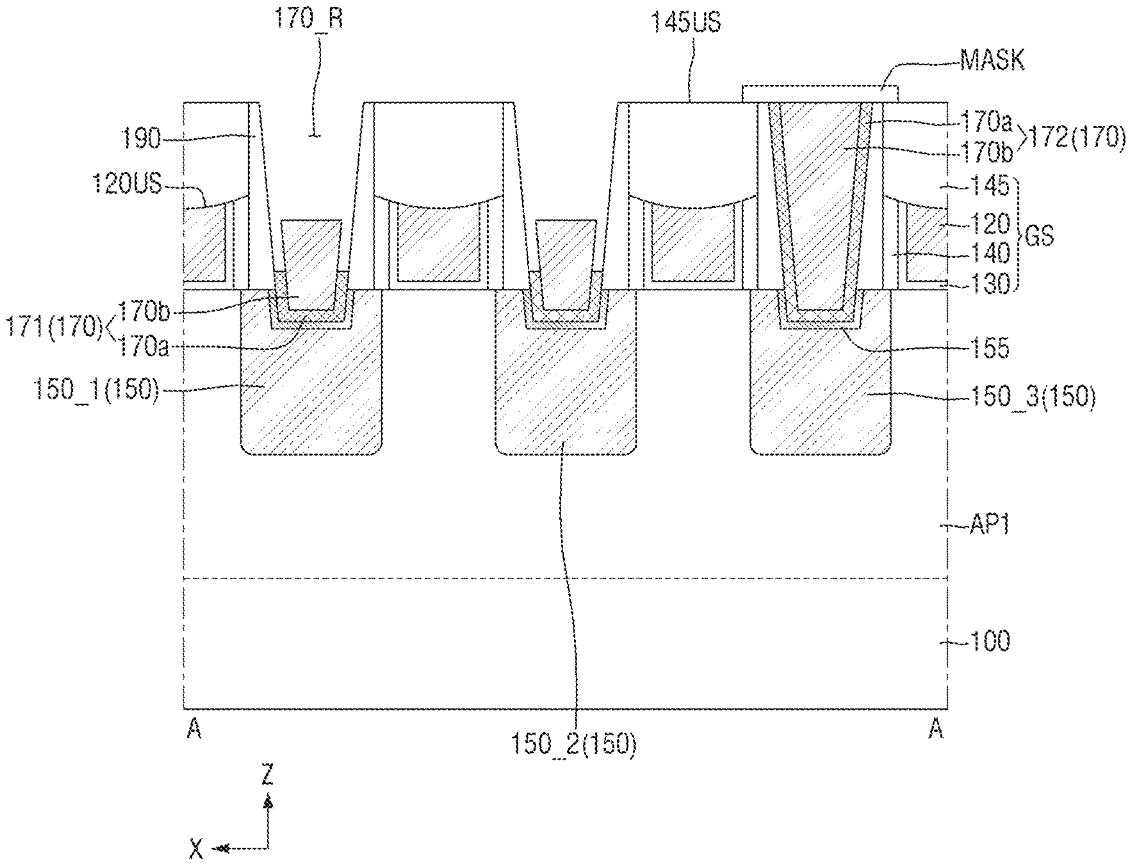

Referring to FIG. 30, parts of the first source/drain barrier films 170*a* of the first portions 171 of the first source/drain contacts 170, exposed by the contact recesses 170_R, may be recessed by an etching process.

When parts of the first source/drain barrier films 170*a* are being removed, the first source/drain filling films 170*b* may not be etched, but the present disclosure is not limited thereto.

The recessed top surfaces of the first source/drain barrier films 170*a* are lower than top surfaces 120US of gate electrodes 120.

Figure 31:
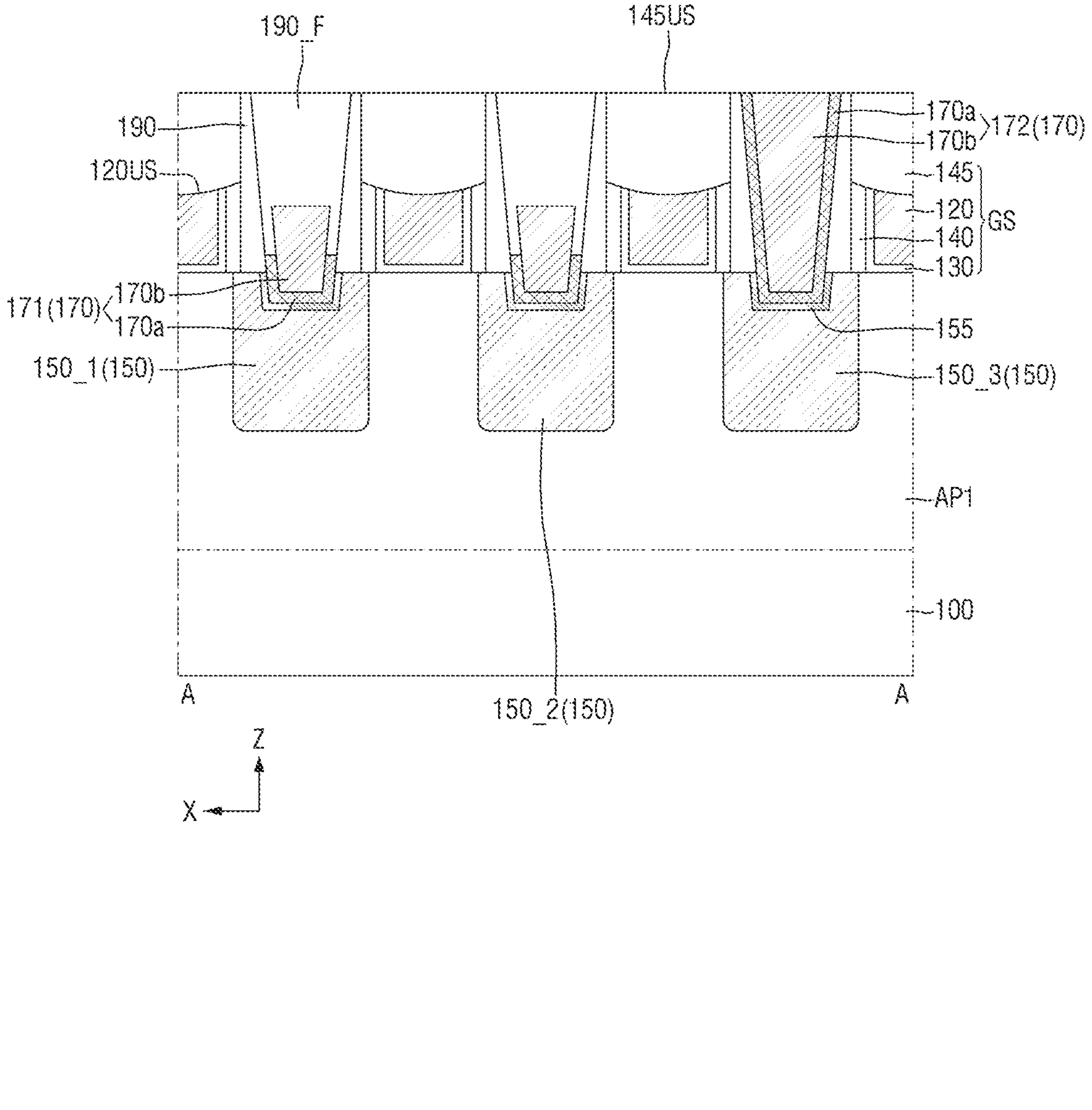

Referring to FIG. 31, filling interlayer insulating films 190_F may be formed in the contact recesses 170_R.

The filling interlayer insulating films 190_F may be formed on the first portions 171 of the first source/drain contacts 170. The filling interlayer insulating films 190_F may be included in the first interlayer insulating film 190.

Although not specifically illustrated, first airgaps (AG1 of FIG. 6) may be formed between the first portions 171 of the first source/drain contacts 170 and gate structures GS.

Thereafter, the mask pattern MASK may be removed.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
- an active pattern comprising a lower pattern and sheet patterns on the lower pattern;
- first and second source/drain patterns connected to the sheet patterns to be spaced apart from each other;
- a first source/drain contact on the first source/drain pattern and comprising a first source/drain barrier film and a first source/drain filling film on the first source/drain barrier film;
- a second source/drain contact on the second source/drain pattern; and
- a gate structure on the lower pattern, between the first and second source/drain contacts, and comprising a gate electrode,
- wherein a top surface of the first source/drain contact is lower than a top surface of the gate structure, relative to a top surface of the active pattern as a base reference level, and
- wherein the first source/drain barrier film partially extends in a first direction along the first source/drain filling film such that a height in the first direction from the top surface of the active pattern to a top surface of the first source/drain barrier film is less than a height from the top surface of the active pattern to a top surface of the first source/drain filling film, and the first source/drain filling film does not contact the top surface of the first source/drain barrier film.

2. The semiconductor device of claim 1, further comprising:
- an interlayer insulating film on the top surface of the first source/drain contact,
- wherein a top surface of the interlayer insulating film is substantially coplanar with the top surface of the gate structure.

3. The semiconductor device of claim 1, further comprising:
- airgaps between the first source/drain filling film and the gate structure.

4. The semiconductor device of claim 1, wherein the top surface of the first source/drain filling film is lower than a top surface of the gate electrode with respect to the top surface of the active pattern.

5. The semiconductor device of claim 1, wherein a height from the top surface of the active pattern to a top surface of the second source/drain contact is equal to a height from the top surface of the active pattern to the top surface of the gate structure.

6. The semiconductor device of claim 5, wherein
- the second source/drain contact comprises a second source/drain barrier film and a second source/drain filling film on the second source/drain barrier film, and
- the second source/drain filling film has an integral structure.

7. The semiconductor device of claim 5, wherein
the second source/drain contact comprises a lower source/drain contact and an upper source/drain contact on the lower source/drain contact, and
the lower source/drain contact comprises a lower source/drain barrier film and a lower source/drain filling film on the lower source/drain barrier film.

8. The semiconductor device of claim 1, wherein
the first source/drain pattern is spaced apart from the second source/drain pattern in a second direction,
the first source/drain filling film comprises a lower portion including the first source/drain barrier film thereon and an upper portion on the lower portion, and
a width of the upper portion of the first source/drain filling film in the second direction decreases in a direction away from the first source/drain pattern.

9. The semiconductor device of claim 1, wherein the top surface of the first source/drain barrier film is higher than the top surface of the active pattern and lower than a top surface of the gate electrode relative to the top surface of the active pattern.

10. A semiconductor device comprising:
an active pattern comprising a lower pattern and sheet patterns on the lower pattern;
first and second source/drain patterns connected to the sheet patterns to be spaced apart from each other;
a first source/drain contact on the first source/drain pattern and comprising a first source/drain barrier film and a first source/drain filling film on the first source/drain barrier film;
a second source/drain contact on the second source/drain pattern; and
a gate structure on the lower pattern, between the first and second source/drain contacts, and comprising a gate electrode,
wherein a top surface of the first source/drain contact is lower than a top surface of the gate structure, relative to a top surface of the active pattern as a base reference level,
wherein a top surface of the first source/drain filling film is higher than or as same as a top surface of the gate electrode with respect to the top surface of the active pattern, and
the first source/drain barrier film partially extends in a first direction along the first source/drain filling film such that a height in the first direction from the top surface of the active pattern to a top surface of the first source/drain barrier film is less than a height from the top surface of the active pattern to the top surface of the first source/drain filling film, and the first source/drain filling film does not contact the top surface of the first source/drain barrier film.

11. The semiconductor device of claim 10, further comprising:
an interlayer insulating film on the top surface of the first source/drain contact,
wherein a top surface of the interlayer insulating film is substantially coplanar with the top surface of the gate structure.

12. The semiconductor device of claim 10, further comprising:
airgaps between the first source/drain filling film and the gate structure.

13. The semiconductor device of claim 10, wherein
the gate structure comprises a gate capping pattern on the gate electrode, and
a height from the top surface of the active pattern to a top surface of the second source/drain contact is equal to a height from the top surface of the active pattern to a top surface of the gate capping pattern.

14. The semiconductor device of claim 13, wherein
the second source/drain contact comprises a second source/drain barrier film and a second source/drain filling film on the second source/drain barrier film, and
the second source/drain filling film has an integral structure.

15. The semiconductor device of claim 13, wherein
the second source/drain contact comprises a lower source/drain contact and an upper source/drain contact on the lower source/drain contact, and
the lower source/drain contact comprises a lower source/drain barrier film and a lower source/drain filling film on the lower source/drain barrier film.

16. The semiconductor device of claim 10, wherein
the first source/drain pattern is spaced apart from the second source/drain pattern in a second direction,
the first source/drain filling film comprises a lower portion including the first source/drain barrier film thereon and an upper portion on the lower portion, and
a width of the upper portion of the first source/drain filling film in the second direction decreases in a direction away from the first source/drain pattern.

17. A semiconductor device comprising:
a fin-type pattern extending in a first direction;
a dummy protruding pattern extending in the first direction and spaced apart from the fin-type pattern in a second direction crossing the first direction;
a field insulating film covering a portion of a sidewall of the fin-type pattern and a top surface of the dummy protruding pattern;
first and second source/drain patterns disposed on the fin-type pattern to be spaced apart from each other in the first direction;
a first source/drain contact on the first source/drain pattern and comprising a first source/drain barrier film and a first source/drain filling film on the first source/drain barrier film;
a second source/drain contact on the second source/drain pattern; and
a gate structure on the fin-type pattern and the field insulating film, between the first and second source/drain contacts, and comprising a gate electrode,
wherein a top surface of the first source/drain contact is lower than a top surface of the gate structure, relative to a top surface of the fin-type pattern as a base reference level, and
wherein the first source/drain barrier film partially extends in a third direction along the first source/drain filling film such that a height in the third direction a height from the top surface of the fin-type pattern to a top surface of the first source/drain barrier film is less than a height from the top surface of the fin-type pattern to a top surface of the first source/drain filling film, and the first source/drain filling film does not contact the top surface of the first source/drain barrier film.

18. The semiconductor device of claim 17, wherein the top surface of the first source/drain filling film is lower than a top surface of the gate electrode with respect to the top surface of the fin-type pattern.

19. The semiconductor device of claim 17, wherein the top surface of the first source/drain filling film is higher than or as same as a top surface of the gate electrode with respect to the top surface of the fin-type pattern.

20. The semiconductor device of claim 17, wherein the first source/drain filling film comprises a lower portion including the first source/drain barrier film thereon and an upper portion on the lower portion, and a width of the upper portion of the first source/drain filling film in the first direction decreases in a direction away from the first source/drain pattern.

* * * * *